(12) United States Patent
Taguchi

(10) Patent No.: US 7,718,343 B2
(45) Date of Patent: May 18, 2010

(54) DECOMPOSABLE RESIN COMPOSITION AND PATTERN-FORMING MATERIAL INCLUDING THE SAME

(75) Inventor: Yoshinori Taguchi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 230 days.

(21) Appl. No.: 11/847,572

(22) Filed: Aug. 30, 2007

(65) Prior Publication Data

US 2008/0070154 A1    Mar. 20, 2008

(30) Foreign Application Priority Data

Aug. 30, 2006  (JP)  .............. 2006-233336
Feb. 22, 2007  (JP)  .............. 2007-042846

(51) Int. Cl.
G03C 1/76    (2006.01)
G03C 1/492   (2006.01)
G03C 1/494   (2006.01)
G03C 1/725   (2006.01)
G03C 1/73    (2006.01)

(52) U.S. Cl. ................. 430/270.1; 430/281.1
(58) Field of Classification Search .............. 430/270.1, 430/281.1
See application file for complete search history.

(56) References Cited

U.S. PATENT DOCUMENTS

| 6,335,144 B1 * | 1/2002 | Murota et al. ............ 430/281.1 |
| 6,653,364 B2 * | 11/2003 | Maehara ........................ 523/1 |
| 2002/0098439 A1 | 7/2002 | Kubo et al. |

FOREIGN PATENT DOCUMENTS

| EP | 1 142 945 A2 | 10/2001 |
| EP | 1 367 089 A1 | 12/2003 |
| EP | 1 489 118 A2 | 12/2004 |
| EP | 1 840 139 A1 | 10/2007 |
| EP | 1 887 423 A1 | 2/2008 |
| JP | 8-258442 A | 10/1996 |
| JP | 10-119436 A | 5/1998 |
| JP | 10-244751 A | 9/1998 |
| JP | 2000-10270 A | 1/2000 |
| JP | 2001-81152 A | 3/2001 |
| JP | 2004-160898 A | 6/2004 |
| JP | 2004-250650 A | 9/2004 |

OTHER PUBLICATIONS

Extended European Search Report dated Oct. 1, 2009.

* cited by examiner

*Primary Examiner*—Geraldina Visconti
(74) *Attorney, Agent, or Firm*—Sughrue Mion, PLLC

(57) ABSTRACT

A decomposable resin composition contains a base generator, and a polyurethane resin capable of being decomposed with a base generated from the base generator.

7 Claims, No Drawings

DECOMPOSABLE RESIN COMPOSITION AND PATTERN-FORMING MATERIAL INCLUDING THE SAME

FIELD OF THE INVENTION

The present invention relates to a decomposable resin composition, more particularly to a resin composition satisfying both of high decomposability enabling engraving with laser and preservation stability and a pattern-forming material including the same.

BACKGROUND OF THE INVENTION

Decomposable resins and decomposable resin compositions means resins decomposable in response to an external factor, for example, a thermal factor, a mechanical factor, a photochemical factor, a radiation-chemical factor or a factor with a chemical agent and are well known. Change in the form (liquefaction or vaporization) or change in the nature or property, for example, molecular weight, hardness, viscoelasticity, glass transition point (Tg), solubility or adhesiveness of the resin or resin composition before and after the decomposition, which is caused by the decomposition of resin, is utilized in various fields.

Examples of the decomposable resin and decomposable resin composition include a biodegradable plastic (for example, polylactic acid) for decreasing environmental impact of plastic material and a slow releasing material which can gradually release a component, for example, medical agent or fragrance in the field of healthcare, cosmetic or life science. However, they gradually decompose by oxygen, light or enzyme in a natural environment, within the living body, in the soil or the like and thus they do not stably maintain their initial states and can not induce at once a large change in the nature upon the external stimulation.

Resins which are decomposed by light or heat for improvement in the recycling efficiency or simplification of the disposal and adhesives which decrease the adhesiveness thereof are also developed. Further, it is known that ceramic or carbon fiber is mixed with a decomposable resin and then the decomposable resin is removed, for example, by calcination to form a porous material. However, in these cases, the materials are altogether treated or processed and it is not intended to form the desired pattern only in the desired portion. Also, large energy is required for the decomposition treatment.

With respect to the application to image formation, for instance, it is known that both preservation stability and image fixability of toner are achieved by utilizing change in the nature due to heat at the heat-fixing of the toner containing a heat-decomposable resin. However, the resin per se does not have sufficient response to the pattern-wise stimulation.

As for pattern-forming materials, on the other hand, for example, a so-called chemically-amplified resist is well known as a photoresist. Specifically, a composition containing an acid generator and an acid-decomposable resin is pattern-wise exposed followed by heat treatment, if desired, to decompose pattern-wise the resin and the pattern is formed with development processing. Although the composition satisfies both the preservation stability and the pattern-forming property at a practical level, the development process in which the processing conditions are fully controlled is indispensable for the formation of pattern. Further, the pattern-formation in a thick layer having, for example, several tens of micrometers or more is difficult, though it is possible to apply to a thin layer.

A method of forming an image utilizing a step of removing (ablation) a part of thin layer by imagewise irradiation of laser beam is also known (JP-A-10-119436 (the term "JP-A" as used herein means an "unexamined published Japanese patent application")). However, the compounds recited as the heat-decomposable resin are only conventional general-purpose resins, for example, polyesters, polycarbonates or polyurethanes, and the thickness of the layer is only around 1 to 2 µm. It is also known to use a compound defined its heat decomposability (JP-A-10-244751 (corresponding to US 2002/0098439 A1)). However, the thickness of the layer described therein is also only around 1 to 2 µm.

As a mask material for paste printing to a printed circuit board or the like, a mask for forming a pattern having approximately 100 to 200 µm utilizing a photo-decomposable resin sheet and a production method of the mask are described (JP-A-8-258442). However, a specific compound does not disclosed in the patent. Also, the controlled development processing is indispensable in order to form the pattern while regulating the degree of exposure and development.

On the other hand, in order to form a pattern in a thick layer by a simple process, for example, pattern-formation by laser processing is known, in which the base material per se is removed, deformed or discolored by imagewise irradiation of laser beam. For instance, a method of recording information, for example, a lot number on a product (for example, video tape or home electric appliances) composed of a variety of base materials is utilized as a laser maker. In such cases, conventional resins are used as they are as the base material.

In the pattern-formation by laser processing, it is desired that a laser engraving portion (concave portion) be rapidly formed. For this purpose, a high-sensitive laser-decomposable pattern-forming material is needed.

In particular, in case of a flexographic printing plate precursor of a direct drawing type by laser (so-called flexographic printing plate precursor for laser engraving), since ease of engraving by laser beam (engraving sensitivity) dominates plate-making speed, a flexographic printing plate precursor for laser engraving using a high-sensitive laser-decomposable resin composition has been required.

On the other hand, as an example of composition containing a base generator, positive type photoresists containing a base generator are known (JP-A-2000-10270 and JP-A-2004-250650). In these examples, however, it is intended not to cause depolymerization of a polymer main chain but to cause change in responsiveness of the polymer to an aqueous alkaline solution or an aqueous acidic solution due to decomposition of side chain.

Further, as an example of laser-decomposable resin composition containing a compound which generates a base, a printing plate precursor capable of conducting laser engraving containing a developer generating a base and a color former is known (JP-A-2004-160898). However, the description of JP-A-2004-160898 does not suggest the combination of a polyurethane resin capable of being decomposed with a base and a base generator according to the invention. More specifically, JP-A-2004-160898 discloses the combination including a developer and a color former in order to form a dye having light absorption in a wavelength range of laser light after photo-curing and the combination does not satisfy the requirement of laser decomposability according to the invention. Further, when the decomposability of the resin is increased, a problem arises in that stability at the time of formation of thick layer decreases.

SUMMARY OF THE INVENTION

An object of the present invention is to provide a decomposable resin composition which has high sensitivity and decomposability to light, for example, laser or heat, is capable of forming stably a thick layer and is excellent in preservation stability, and a pattern-forming material including the composition.

The present invention includes the following.
(1) A decomposable resin composition comprising component (A) and component (B) shown below:
Component (A): a base generator
Component (B): a polyurethane resin capable of being decomposed with a base generated from the base generator.
(2) A laser-decomposable resin composition comprising component (A) and component (B) shown below:
Component (A): a base generator
Component (B): a polyurethane resin capable of being decomposed with a base generated from the base generator.
(3) A resin composition for image formation comprising component (A) and component (B) shown below:
Component (A): a base generator
Component (B): a polyurethane resin capable of being decomposed with a base generated from the base generator.
(4) The composition as described in any one of (1) to (3) above, which further comprises (C) a base propagator.
(5) The composition as described in any one of (1) to (4) above, which further comprises (D) a polymerizable compound.
(6) A decomposable resin composition prepared by curing the composition as described in (5) above.
(7) A pattern-forming material comprising a layer comprising the composition as described in any one of (1) to (5) above.
(8) The pattern-forming material as described in (7) above which is a flexographic printing plate precursor for laser engraving.

According to the present invention, a decomposable resin composition which has high sensitivity and decomposability to light, for example, laser or heat, is capable of forming stably a thick layer and is excellent in preservation stability, and a pattern-forming material including the composition can be provided.

DETAILED DESCRIPTION OF THE INVENTION

The invention will be described in more detail below.

First, the polyurethane resin capable of being decomposed with a base, base generator and base propagator for use in the invention are described below.

(Polyurethane Resin Capable of being Decomposed with a Base Generated from the Base Generator)

With respect to the polyurethane resin capable of being decomposed with a base (hereinafter, simply referred to as a polyurethane resin, sometimes) for use in the invention, any appropriate polyurethane resin capable of being decomposed with a base generated from the base generator described hereinafter may be employed.

Among them, as the polyurethane resin to be used, a polyurethane resin capable of being decomposed with a base, a conjugate acid of which has pKa of 6 or more, is preferable, and a polyurethane resin capable of being decomposed with a base, a conjugate acid of which has pKa of 8 or more, is more preferable, from the standpoint of decomposability due to a base generated from the base generator described hereinafter.

As such a polyurethane resin, a polyurethane resin synthesized from a diol monomer represented by formula (I) or (II) shown below is preferably used from the stand point of satisfying both of decomposability and stability.

HO—Ar—OH (I)

In formula (I), Ar represents a divalent aromatic group which may be substituted.

$$HO-A-\underset{R_1}{CH}-OH \quad (II)$$

In formula (II), A represents a divalent connecting group, and $R_1$ represents a hydrogen atom or a monovalent substituent.

It is believed that in the polyurethane resin prepared from the diol represented by formula (I), since the urethane bond is adjacent to the aromatic group, the urethane bond is apt to be decomposed with a base.

It is also believed that in the polyurethane resin prepared from the diol represented by formula (II), the secondary or tertiary carbon is present adjacent to the urethane bond, and the hydrogen atom on the secondary or tertiary carbon is drawn with a base, whereby decomposition of the urethane resin is accelerated.

The diol monomer represented by formula (II) is preferably a compound represented by formula (III) shown below. Also, a compound represented by formula (IV) shown below is preferable.

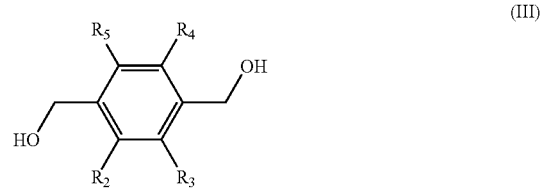

(III)

In formula (III), $R_2$ to $R_5$ each represents a hydrogen atom or a monovalent substituent. At least one of $R_2$ to $R_5$ is preferably an electron-withdrawing group, and it is more preferable that the sum total of Hammett substituent constant σm of $R_2$ to $R_5$ is from +0.01 to +0.7.

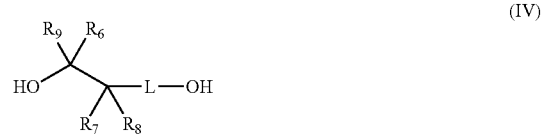

(IV)

In formula (IV), $R_6$ to $R_9$ each represents a hydrogen atom or a monovalent substituent, and L represents a divalent connecting group. It is particularly preferable that the sum total of Hammett substituent constant σm of $R_7$, $R_8$ and L is from +0.01 to +0.7.

Specific examples of the diol monomer represented by formula (I) are set forth below, but the invention should not be construed as being limited thereto.

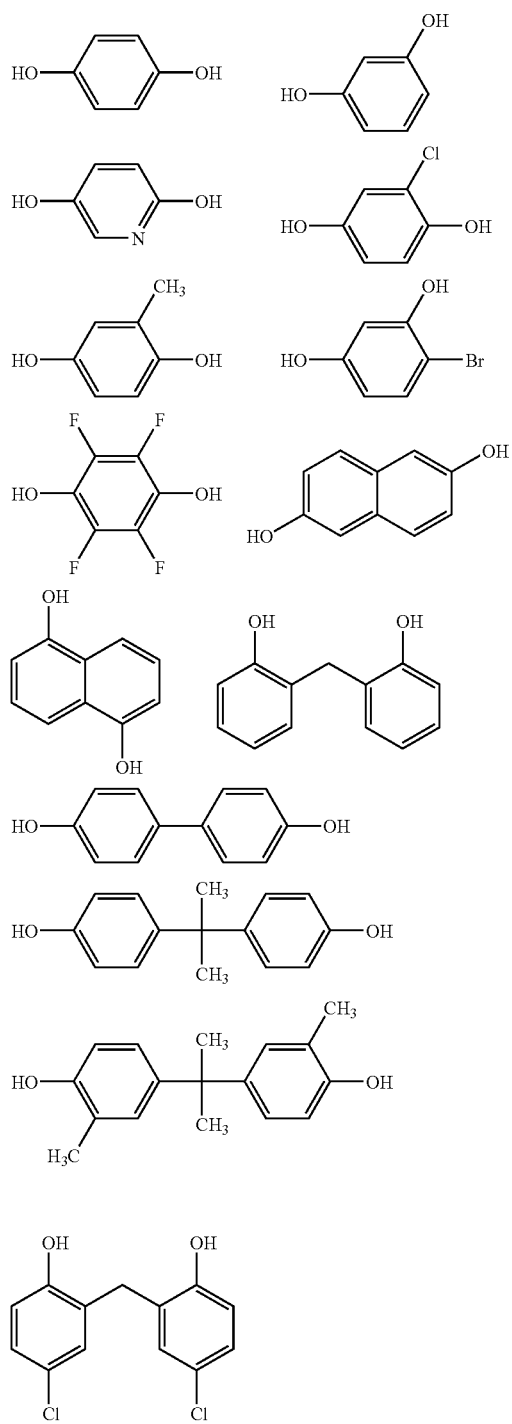
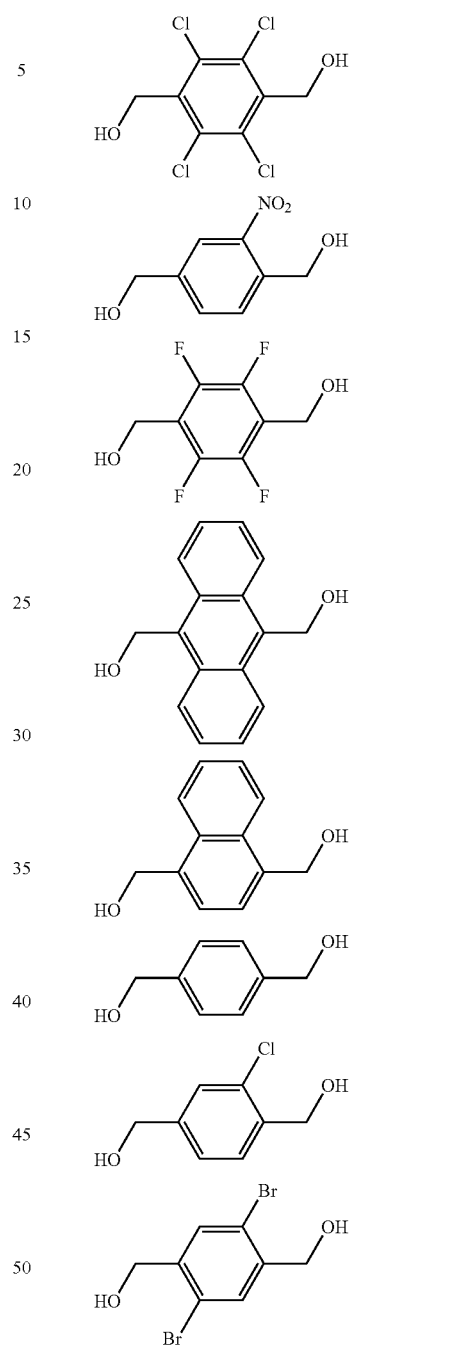
Specific examples of the diol monomer represented by formula (II) or (III) are set forth below, but the invention should not be construed as being limited thereto.
Specific examples of the diol monomer represented by formula (IV) are set forth below, but the invention should not be construed as being limited thereto.
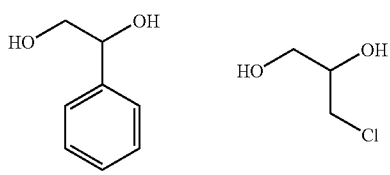

-continued

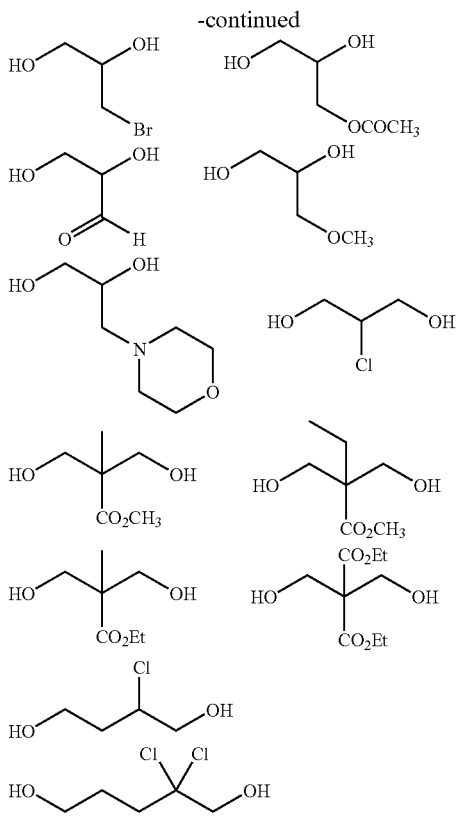

The polyurethane resin capable of being decomposed with a base according to the invention includes a polyurethane resin comprising as the basic skeleton, a structural unit based on a reaction product of at least one diisocyanate compound represented by formula (1) shown below and at least one diol compound represented by formula (2) shown below. Particularly referable examples of the diol compound include those described above.

OCN—X⁰—NCO        (1)

HO—Y⁰—OH        (2)

In formulae (1) and (2), $X^0$ and $Y^0$ each independently represents a divalent organic residue.

The polyurethane resin is ordinarily synthesized by combining various diisocyanate compounds with various diol compounds.

In the production of polyurethane resin, conventionally known other diisocyanate compounds and other diol compounds can be used within a range which does not impair the effects of the invention in addition to the diol compound represented by any one of formulae (I) to (IV) described above. Specifically, compounds described in The Society of Polymer Science, Japan ed., *Kobunshi Date Handbook-Kisohen* (*Polymer Data Handbook-Fundamental Volume*), Baifukan Co., Ltd (1986) are exemplified. These other diisocyanate compounds and other diol compounds may be used individually or in combination of two or more thereof, respectively.

Specific examples of the other diisocyanate compound include an aromatic diisocyanate compound, for example, 2,4-tolylene diisocyanate, dimer of 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate or 3,3'-dimethylbiphenyl-4,4'-diisocyanate; an aliphatic diisocyanate compound, for example, hexamethylene diisocyanate, trimethylhexamethylene diisocyanate, lysine diisocyanate or dimeric acid diisocyanate; an alicyclic diisocyanate compound, for example, isophorone diisocyanate, 4,4'-methylenebis(cyclohexyl isocyanate), methylcyclohexane-2,4(or 2,6)-diisocyanate or 1,3-(isocyanatomethyl)cyclohexane; and a diisocyanate compound which is a reaction product of a diol with a diisocyanate, for example, an adduct of 1 mole of 1,3-butylene glycol and 2 moles of tolylene diisocyanate.

Specific examples of the other diol compound include ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrogenated bisphenol A, a propylene oxide adduct of hydrogenated bisphenol A, hydroquinone dihydroxy ethyl ether, p-xylylene glycol, dihydroxyethylsulfone, bis(2-hydroxyethyl)-2,4-tolylenedicarbamate, 2,4-tolylene-bis(2-hydroxyethylcarbamide), bis(2-hydroxyethyl)-m-xylylenedicarbamate, bis(2-hydroxyethyl)isophthalate, 1,3-propanediol, 1,4-butanediol, 1,5-pentanediol, 1,6-hexanediol, 1,7-heptanediol, 1,8-octanediol, 2-butene-1,4-diol, cis-2-butene-1,4-diol, trans-2-butene-1,4-diol, catechol, resorcine, hydroquinone, 4-methylcatechol, 4-tert-butylcatechol, 4-acetylcatechol, 3-methoxycatechol, 4-phenylcatechol, 4-methylresorcine, 4-ethylresorcine, 4-tert-butylresorcine, 4-hexylresorcine, 4-chlororesorcine, 4-benzylresorcine, 4-acetylresorcine, 4-carboxymethoxyresorcine, 2-methylresorcine, 5-methylresorcine, tert-butylhydroquinone, 2,5-di-tert-butylhydroquinone, 2,5-di-tert-amylhydroquinone, tetramethylhydroquinone, tetrachlorohydroquinone, methylcarboaminohydroquinone, methylureidohydroquinone, methylthiohydroquinone, benzonorbornene-3,6-diol, bisphenol A, bisphenol S, 3,3'-dichlorobisphenol S, 4,4'-dihydroxybenzophenone, 4,4'-dihydroxybiphenyl, 4,4'-thiodiphenol, 2,2'-dihydroxydiphenylmethane, 3,4-bis(p-hydroxyphenyl)hexane, 1,4-bis(2-p-hydroxyphenyl)propyl) benzene, bis(4-hydroxyphenyl)methylamine, 1,3-dihydroxynaphthalene, 1,4-dihydroxynaphthalene, 1,5-dihydroxynaphthalene, 2,6-dihydroxynaphthalene, 1,5-dihydroxyanthraquinone, 2-hydroxybezyl alcohol, 4-hydroxybezyl alcohol, 2-hydroxy-3,5-di-tert-butylbezyl alcohol, 4-hydroxy-3,5-di-tert-butylbezyl alcohol, 4-hydroxyphenethyl alcohol, 2-hydroxyethyl-4-hydroxybenzoate, 2-hydroxyethyl-4-hydroxyphenylacetate, resorcine mono-2-hydroxyethyl ether, diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having an average molecular weight of 1,000, polyethylene glycol having an average molecular weight of 1,500, polyethylene glycol having an average molecular weight of 2,000, polyethylene glycol having an average molecular weight of 3,000, polyethylene glycol having an average molecular weight of 7,500, polypropylene glycol having an average molecular weight of 400, polypropylene glycol having an average molecular weight of 700, polypropylene glycol having an average molecular weight of 1,000, polypropylene glycol having an average molecular weight of 2,000, polypropylene glycol having an average molecular weight of 3,000, polypropylene glycol having an average molecular weight of 4,000, a polyether diol compound, for example, PTMG650, PTMG1000, PTMG2000, PTMG3000, Newpol PE-61, Newpol PE-62, Newpol PE-64, Newpol PE-68, Newpol PE-71, Newpol PE-74, Newpol PE-75, Newpol PE-78, Newpol PE-108, Newpol PE-128, Newpol BPE-20, Newpol BPE-20F, Newpol BPE-20NK, Newpol BPE-20T, Newpol BPE-20G, Newpol BPE-40, Newpol BPE-60, Newpol BPE-100, Newpol BPE-180, Newpol BPE-2P, Newpol BPE-23P, Newpol BPE-3P, Newpol BPE-5P, Newpol 50HB-100, Newpol 50HB-260, Newpol 50HB-400, Newpol 50HB-660, Newpol 50HB-2000 or Newpol 50HB-5100 (produced by Sanyo Chemical Industries, Ltd.), a polyester diol compound and a polycarbonate diol compound.

Also, a diol compound having a carboxyl group, for example, 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl) acetic acid, bis(4-hydroxyphenyl)acetic acid, 2,2-bis (hydroxymethyl)butyric acid, 4,4-bis(4-hydroxyphenyl)pentanoic acid, tartaric acid, N,N-dihydroxyethylglycine or N,N-bis(2-hydroxyethyl)-3-carboxypropionamide can be used in combination.

Further, an aliphatic diamine compound, for example, ethylenediamine, propylenediamine, tetramethylenediamine, pentamethylenediamine, hexamethylenediamine, heptamethylenediamine, octamethylenediamine, dodecamethylenediamine, propane-1,2-diamine, bis(3-aminopropyl)methylamine, 1,3-bis(3-aminopropyl)tetramethylsiloxane, piperazine, 2,5-dimethylpiperazine, N-(2-aminoethyl)piperazine, 4-amino-2,2,6,6-tetramethylpiperidine, N,N-dimethylethylenediamine, lysine, L-cystine or isophorondiamine; an aromatic diamine compound, for example, o-phenylenediamine, m-phenylenediamine, p-phenylenediamine, 2,4-tolylenediamine, benzidine, o-ditoluidine, o-dianisidine, 4-nitro-m-phenylenediamine, 2,5-dimethoxy-p-phenylenediamine, bis(4-aminophenyl)sulfone, 4-carboxy-o-phenylenediamine, 3-carboxy-m-phenylenediamine, 4,4'-diaminophenyl ether or 1,8-naphthalenediamine; a heterocyclic amine compound, for example, 2-aminoimidazole, 3-aminotriazole, 5-amino-1H-tetrazole, 4-aminopyrazole, 2-aminobenzimidazole, 2-amino-5-carboxytriazole, 2,4-diamono-6-methyl-S-triazine, 2,6-diaminopyridine, L-hystidine, DL-tryptophan or adenine; and an aminoalcohol or aminophenol compound, for example, ethanolamine, N-methylethanolamine, N-ethylethanolamine, 1-amino-2-propanol, 1-amino-3-propanol, 2-aminoethoxyethanol, 2-aminothioethoxyethanol, 2-amino-2-methyl-1-propanol, p-aminophenol, m-aminophenol, o-aminophenol, 4-methyl-2-aminophenol, 2-chloro-4-aminophenol, 4-methoxy-3-aminophenol, 4-hydroxybenzylamine, 4-amino-1-naphthol, 4-aminosalicylic acid, 4-hydroxy-N-phenylglycine, 2-aminobenzyl alcohol, 4-aminophenethyl alcohol, 2-carboxy-5-amino-1-naphthol or L-tyrosine can also be used.

A urethane polymer prepared by capping an unreacted terminal isocyanate group with an alcohol compound containing a radical polymerizable group to terminate the reaction in the synthesis of polymer is more preferable because of further improvement in printing durability. Examples of the alcohol compound containing a radical polymerizable group include 2-hydroxyethyl(meth)acrylate, 2-hydroxypropyl (meth)acrylate, 2-hydroxy-3-chloropropyl(meth)acrylate, 2-hydroxy-3-allyloxypropyl(meth)acrylate, 2-hydroxy-3-phenoxypropyl(meth)acrylate, 4-hydroxybutyl(meth)acrylate, glycerol diacrylate, glycerol acrylate methacrylate, glycerol dimethacrylate, pentaerythritol triacrylate and tris (acryloyloxyethyl) isocyanulate.

The polyurethane resins according to the invention may be used individually or in combination of two or more thereof. Further, one or more conventionally known polymer binders may be added to the polyurethane resin according to the invention and the resulting mixture may be used. The amount of the polymer binder added to the polyurethane resin according to the invention in the case of using as the mixture is ordinarily from 1 to 60% by weight, preferably from 1 to 40% by weight, more preferably from 1 to 20% by weight, based on the total weight of the resin component. As the polymer binder added, conventionally known polymer binders are employed without any limitation. Specifically, for example, acryl main chain binders, urethane binders or acetal-modified polyvinyl alcohol resins (for example, a butyral resin) conventionally used in the field of art can be preferably employed.

The weight average molecular weight of the polyurethane resin according to the invention is preferably from 5,000 to 500,000, more preferably from 8,000 to 30,000, and most preferably from 10,000 to 150,000, from the standpoint of the laser decomposability, stability and printing durability.

Specific examples of the polyurethane resin capable of being decomposed with a base for use in the invention are set forth below, but the invention should not be construed as being limited thereto. In the specific examples below, the numerical number attached to each repeating unit means a molar percent of the repeating unit, and n represents a repeating number of the repeating units.

| | Molecular weight |
|---|---|
| (P-1) | $3.1 \times 10^4$ |

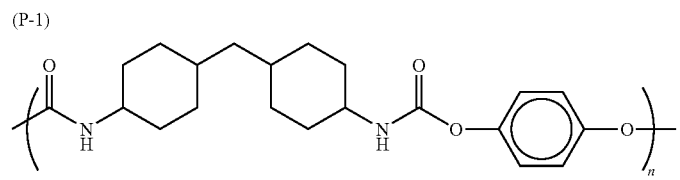

-continued

| | Molecular weight |
|---|---|
| (P-2) | $2.5 \times 10^4$ |
| (P-3) | $3.0 \times 10^4$ |
| (P-4) | $3.5 \times 10^4$ |
| (P-5) | $4.8 \times 10^4$ |
| (P-6) | $4.5 \times 10^4$ |

-continued

| | Molecular weight |
|---|---|
| (P-7) | $4.8 \times 10^4$ |
| (P-8) | $4.0 \times 10^4$ |
| (P-9) | $4.5 \times 10^4$ |
| (P-10) | $5.0 \times 10^4$ |
| (P-11) | $3.0 \times 10^4$ |

-continued

| | Molecular weight |
|---|---|
| (P-12) | $3.1 \times 10^4$ |
| (P-13) | $3.5 \times 10^4$ |
| (P-14) | $3.3 \times 10^4$ |
| (P-15) | $3.5 \times 10^4$ |
| (P-16) | $3.9 \times 10^4$ |

-continued

| | Molecular weight |
|---|---|
| (P-17) | $4.9 \times 10^4$ |
| (P-18) | $5.5 \times 10^4$ |
| (P-19) | $5.0 \times 10^4$ |
| (P-20) | $4.5 \times 10^4$ |

-continued
| | Molecular weight |
|---|---|
| (P-21) 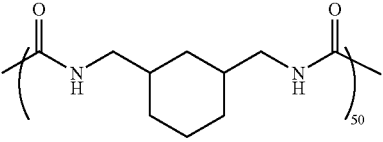 | $3.5 \times 10^4$ |
| (P-22) 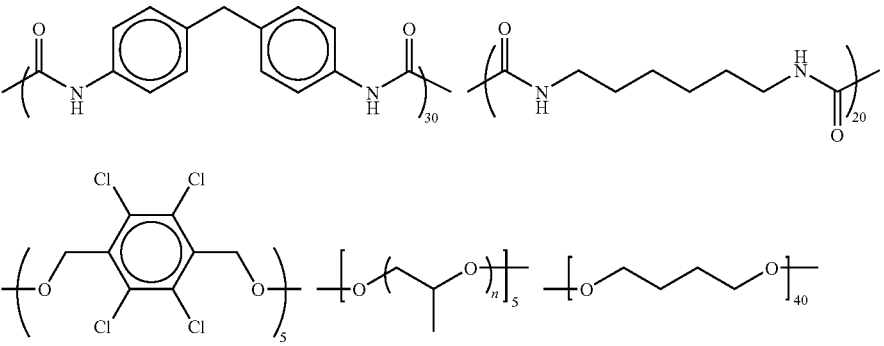 | $5.3 \times 10^4$ |
| (P-23) 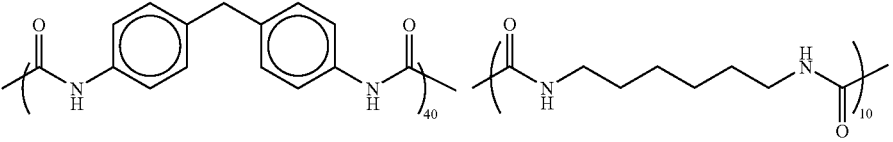 | $4.5 \times 10^4$ |
| (P-24) 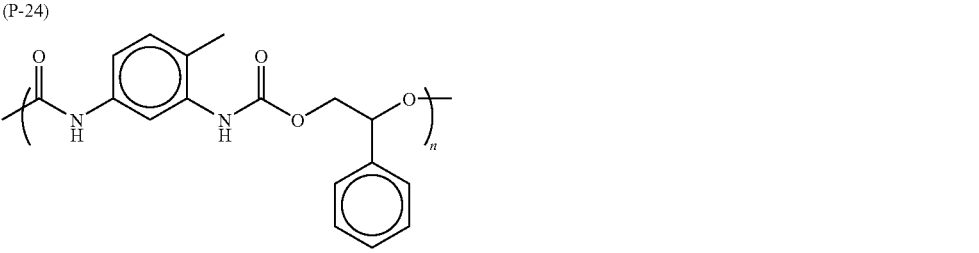 | $3.2 \times 10^4$ |
| (P-25) 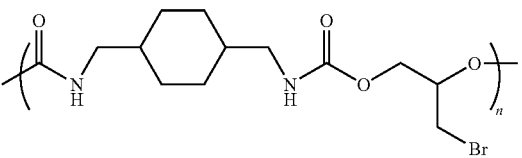 | $2.8 \times 10^4$ |

-continued

| | Molecular weight |
|---|---|
| (P-26) [chemical structure] | $3.0 \times 10^4$ |
| (P-27) [chemical structure] | $2.9 \times 10^4$ |
| (P-28) [chemical structure] | $3.5 \times 10^4$ |
| (P-29) [chemical structure] | $2.8 \times 10^4$ |
| (P-30) [chemical structure] | $3.0 \times 10^4$ |
| (P-31) [chemical structure] | $4.0 \times 10^4$ |

|  | Molecular weight |
|---|---|
| 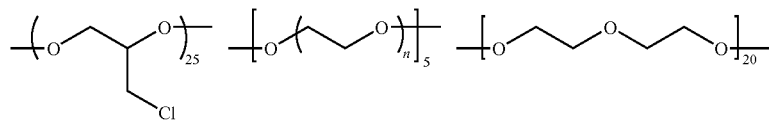 | |
| (P-32) 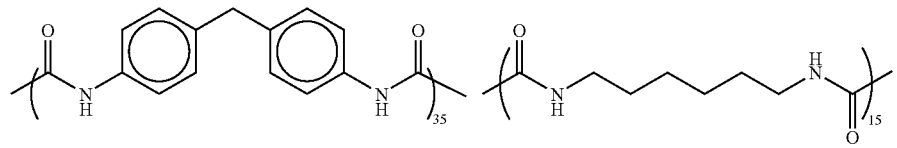 | $3.9 \times 10^4$ |
| 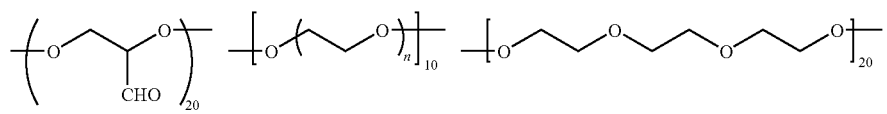 | |
| (P-33) 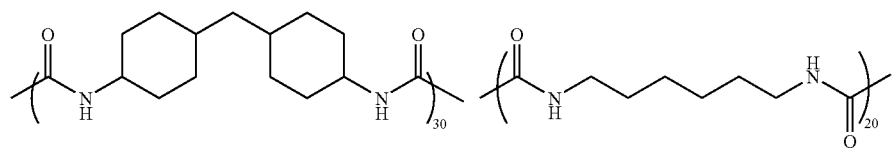 | $4.2 \times 10^4$ |
| 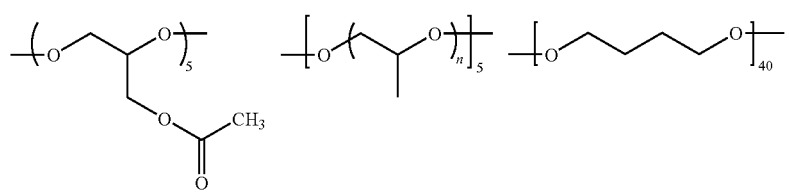 | |
| (P-34) 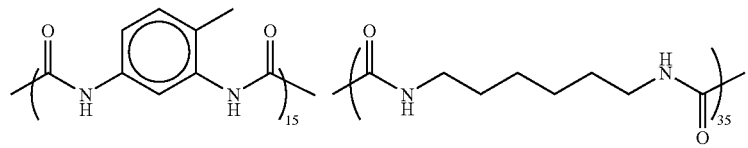 | $4.4 \times 10^4$ |
| 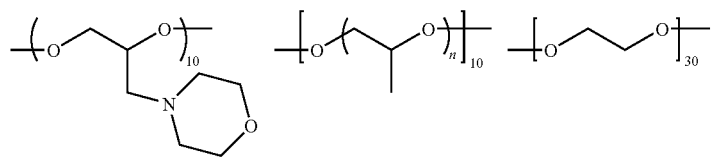 | |
| (P-35) 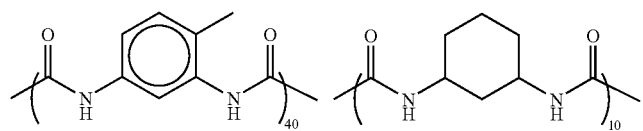 | $4.9 \times 10^4$ |
| 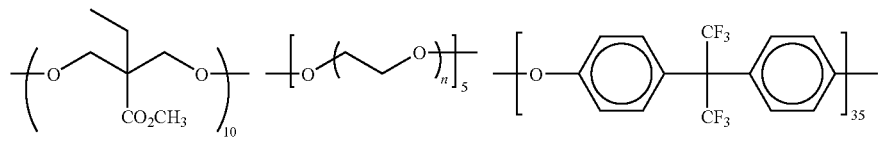 | |

A synthesis example of the polyurethane resin capable of being decomposed with a base according to the invention is described below.

<Synthesis of Compound (P-17)>

In a 300 ml three-necked flask were put 100 ml of N-methyl-2-pyrrolidinone, 2.50 g of 2-nitro-p-xylylene glycol, 6.80 g of polyethylene glycol (molecular weight: 2,000), 6.02 g of hexamethylene glycol, 2.28 g of hexamethylene diisocyanate and 13.60 g of 4,4'-diphenylmethane diisocyanate, the mixture was heated at 50° C. with stirring until the solid was completely dissolved in the solvent, two drops of Neostan (produced by Nitto Kasei Co., Ltd.) were added to the solution and the solution was further heated at 70° C. with stirring for 5 hours. To the reaction solution was added 3 ml of methanol and the solution was further stirred at 50° C. for one hour and then cooled to room temperature. The resulting reaction solution was poured into 3 liters of water to obtain 28.5 g of white powder. It was confirmed that the product was the desired compound by an NMR spectrum, an IR spectrum and GPC measurement.

(Base Generator)

As the base generator for use in the invention, compounds described from page 6, upper left column, line 2 to page 6, upper right column, line 15 of JP-A-2-166450, specifically, compounds undergoing some reaction by heat and/or light to release a base, for example, a salt comprising an organic acid capable of undergoing decarboxylation by heat and/or light and a base or a compound capable of releasing an amine by a reaction, for example, an intramolecular nucleophilic substitution reaction, Lossen rearrangement or Beckmann rearrangement are preferably used.

The compound generating a base by heat specifically includes a salt of a base and an acid. Examples of the base include guanidine, triphenylguanidine, tricyclohexylguanidine, piperidine, morpholine, p-toluidine and 2-picoline. Examples of the acid include acetic acid, trichloroacetic acid, phenylsulfonylacetic acid, 4-methylsulfonylphenylsulfonylacetic acid, 4-acetylaminomethyl propionic acid, oxalic acid, maleic acid, succinic acid, fumaric acid, carbonic acid and bicarbonic acid.

The compound generating a base by light specifically includes nonionic base generators, for example, compounds represented by formulae (1) to (4) shown below or a nifedipine, and ionic base generators, for example, a cobalt ammine complex, quaternary ammonium salts represented by formulae (5) and (6) shown below. The base generators may be used individually or in combination of two or more thereof. Further, the base generator can be used together with other sensitizer or the like.

(1)

In formula (1), $R^1$ represents a monovalent organic group having from 1 to 30 carbon atoms, $R^2$ represents a mono- to tetra-valent organic group having from 1 to 20 carbon atoms, and m represents an integer of 1 to 4. It is preferred that $R^1$ includes an aromatic ring having a methoxy group or a nitro group in its side chain.

(2)

In formula (2), $R^2$ and m have the same meanings as those defined in formula (1) above respectively, and $R^3$ and $R^4$ each independently represents a monovalent organic group having from 1 to 30 carbon atoms, or $R^3$ and $R^4$ may be combined with each other to from a cyclic structure.

(3)

In formula (3), $R^2$, $R^3$, $R^4$ and m have the same meanings as those defined in formula (2) above respectively.

(4)

In formula (4), $R^2$ has the same meaning as that defined in formula (1) above, and $R^5$ and $R^6$ each independently represents a monovalent organic group having from 1 to 30 carbon atoms, or $R^5$ and $R^6$ may be combined with each other to from a cyclic structure, or at least one of $R^5$ and $R^6$ may be a hydrogen atom.

(5)

In formula (5), $R^5$ and $R^6$ have the same meanings as those defined in formula (4) above respectively, $R^7$ represents a monovalent organic group having from 1 to 30 carbon atoms which may include an aromatic ring having an alkoxy group, a nitro group, an amino group, an alkyl-substituted amino group or an alkylthio group in its side chain, and $R^8$ represents a divalent organic group having from 1 to 30 carbon atoms.

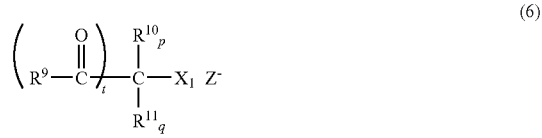
(6)

In formula (6), $R^9$ represents a monovalent organic group having from 1 to 30 carbon atoms, $R^{10}$ and $R^{11}$ each independently represents a monovalent organic group having from 1 to 30 carbon atoms or a hydrogen atom, $X_1$ represents a monovalent group represented by any one of formulae (6A), (6B), (6C), (6D), (6E) or (6F) (hereinafter, also referred to as "(6A) to (6F)"), $Z^-$ represents a counter ion of the ammonium salt, t represents an integer of 1 to 3, and p and q each represents an integer of 0 to 2, provided that t+p+q=3.

(6A)

(6B)

(6C)

(6D)

(6E)

(6F)

In formulae (6A) to (6F), $R^{12}$, $R^{13}$, $R^{14}$ and $R^{15}$ each independently represents a monovalent organic group having from 1 to 30 carbon atoms, $R^{16}$, $R^{17}$ and $R^{18}$ each independently represents a divalent organic group having from 1 to 30 carbon atoms or a single bond, and $R^{19}$ and $R^{20}$ each independently represents a trivalent organic group having from 1 to 30 carbon atoms.

Also, in order to enlarge a light-sensitive wavelength of the base generator generating a base by light, a photosensitizer may appropriately exist together.

The amount of the base generator added is preferably from 1 to 1,000 parts by weight, and more preferably from 10 to 500 parts by weight, per 100 parts by weight of the polyurethane resin in view of engraving sensitivity.

Specific examples of the base generator generating a base by light preferably used in the invention are set forth below, but the invention should not be construed as being limited thereto.

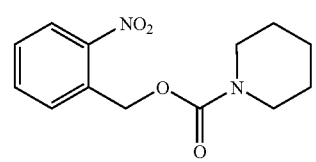
B-1

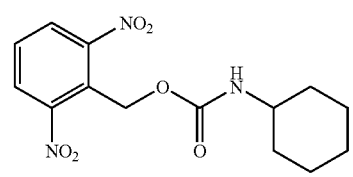
B-2

-continued
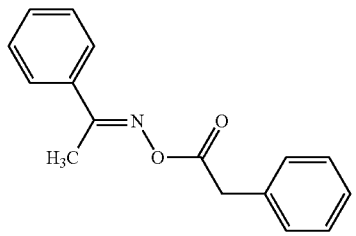 B-3
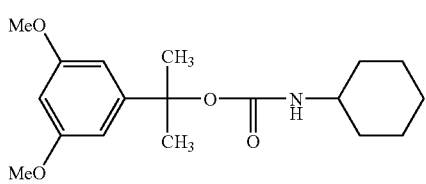 B-4
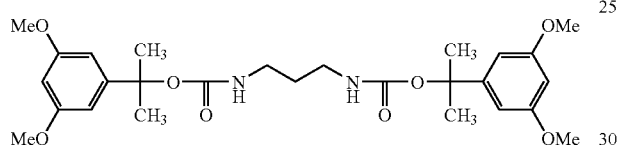 B-5
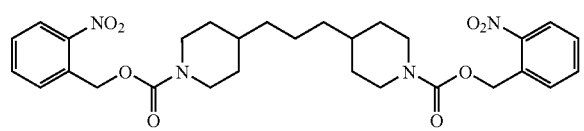 B-6
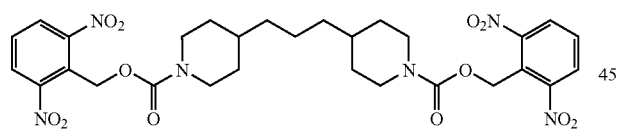 B-7
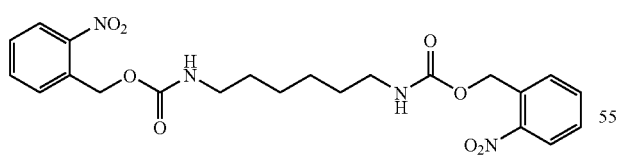 B-8
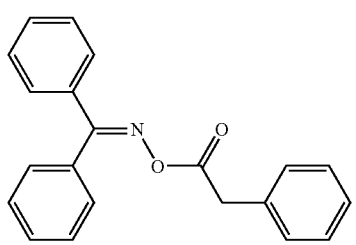 B-9
-continued
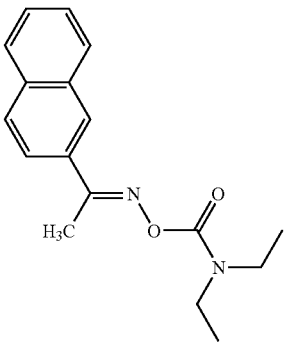 B-10
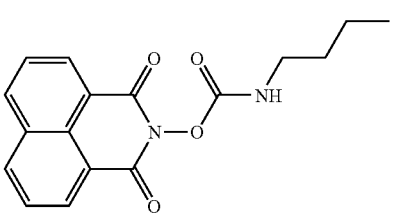 B-11
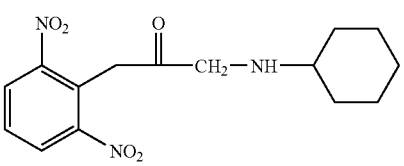 B-12
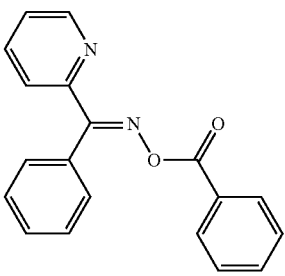 B-13
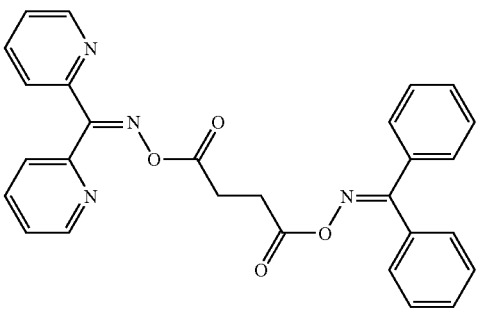 B-14

-continued

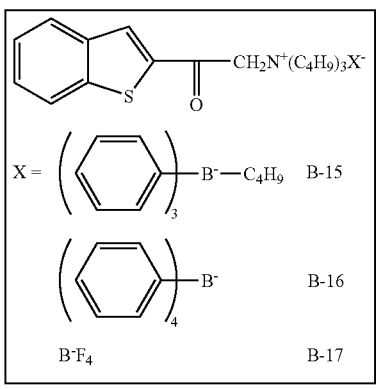

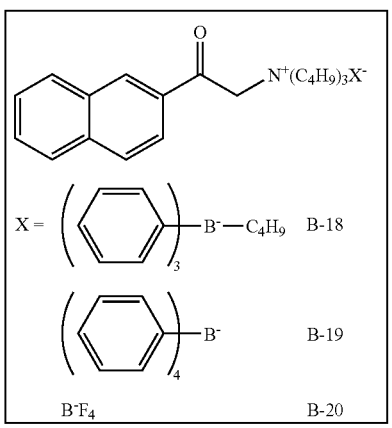

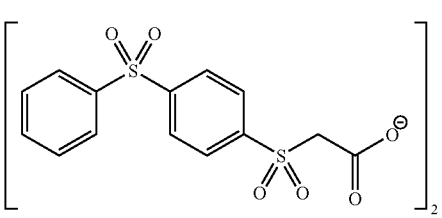

B-21

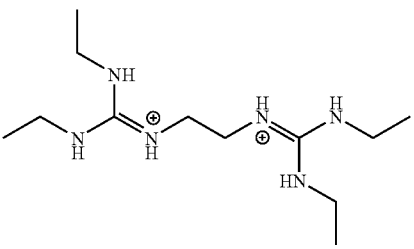

B-22

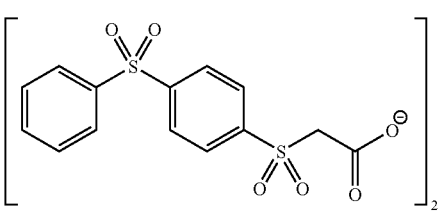

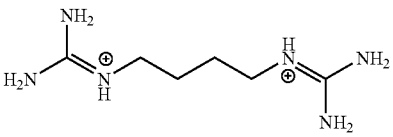

-continued

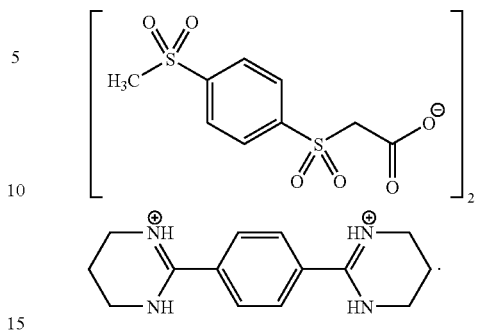

B-23

A synthesis example of the base generator according to the invention is described below.

<Synthesis of Precursor A for Compound (B-6)>

In a 300 ml three-necked flask were put 19.0 g of 2-nitrobenzyl alcohol, 80 g of tetrahydrofuran and 10.3 g of pyridine, and the mixture was stirred for 30 minutes under cooling with ice. When the temperature reached 6° C. or below, 25 g of 4-nitrophenyl chloroformate was dropwise added while keeping the inner temperature at 10° C. or below. The reaction solution was heated at 70° C. for 5 hours with stirring, allowed to cool to room temperature and then poured into 2 liters of water. The resulting white solid was slurried using 50 ml of ethyl acetate to wash and filtered to obtain 31.6 g of Precursor A for Compound (B-6). It was confirmed that the product was the desired compound by an NMR spectrum, an IR spectrum and a mass spectrum.

<Synthesis of Compound (B-6)>

In a 200 ml round-bottom flask were put 3.2 g of 4,4'-trimethylenepiperidine, 60 g of tetrahydrofuran and 10.18 g of Precursor A for Compound (B-6), and the mixture was heated at 70° C. for 5 hours with stirring. The resulting reaction solution was poured into one liter of water and extracted with ethyl acetate. The oily layer was washed with an aqueous 10% by weight sodium hydroxide solution and then a saturated sodium chloride solution and the extract was concentrated. The crude Compound (B-6) obtained was purified using column chromatography and the developing solvent was concentrated to obtain 6.1 g of white powder. It was confirmed that the product was the desired compound by an NMR spectrum, an IR spectrum and GPC measurement.

According to the laser decomposition, in general, a polymer compound or an additive, for example, a dye as described hereinafter absorbs laser light to generate heat and by the heat, the polymer or the like undergoes melting, evaporation, decomposition or combustion, whereby a concavo-convex image is formed. Since many polymers and crosslinking agents are connected by covalent bonds, their evaporation/decomposition temperatures are high. On the other hand, as for the group of compounds according to the invention, a basic compound is generated by cleavage of the base generator due to heat and the basic compound reacts with the urethane resin to break the main chain of the urethane resin, whereby the urethane resin is decomposed into the monomer units. It is believed that since such a mechanism is able to assist the melting, evaporation, decomposition or combustion in the laser decomposition system, high sensitivity can be achieved. It is also believed that since the base generator does not decompose at the time of film formation or preservation, the stability is also achieved.

(Base Propagator)

According to the invention, a base propagator may be used, if desire. The base propagator for use in the invention has a feature in that it is decomposed by the action of a base to generate a base and it is decomposed to generate a base upon the action of the base same as that generated. Therefore, only when a smaller equivalent of the base than the amount of the base propagators is reacted with the base propagators, the base propagators are decomposed in a self-propagating manner and the whole thereof is finally decomposed so that a large amount of bases corresponding to the base propagators can be generated. As the base propagator, for example, compounds described in paragraph Nos. 0010 to 0032 of JP-A-2000-330270 are exemplified.

Specifically, urethane compounds having the above-described feature are preferably exemplified. Such a base propagator includes a urethane compound having at least one urethane bond which is decomposed by the action of a base (ammonia or amine) resulting from the amino group forming the urethane bond to generate a base (ammonia or amine) resulting from the urethane bond. As a matter of course, the urethane compound is decomposed by the action of a base different from the base resulting from the amino group forming the urethane bond to generate a base.

Whether such a urethane compound functions as the base propagator or not can be determined by a simple preexamination as described below.

(Method for Determination of Base Propagation Function)

To a 2% by weight methanol-$d_4$ solution of a urethane compound is added 0.1% by weight of a base (HNR1R2) which is same as a base resulting from an amino group (—NR1R2) forming a urethane bond (—OCOHNR1R2) of the urethane compound to prepare a solution and the solution is put into a test tube for NMR spectrum measurement. The test tube is sealed and heated at 100° C., to conduct NMR spectrum measurement. By increase in the NMR signal of olefin produced by the decomposition of urethane compound, it is determined that the urethane compound has the base propagation function.

The urethane compound as the base propagator includes ordinarily urethane compounds represented by formula (5) shown below.

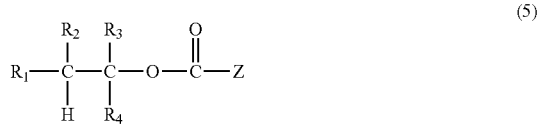

(5)

In formula (5), $R_1$ and $R_2$ each represents a hydrogen atom, a substituent or an electron-withdrawing group, provided that at least one of $R_1$ and $R_2$ is an electron-withdrawing group, $R_3$ and $R_4$ each represents a hydrogen atom or a substituent, and Z represents an amino group.

The above-described electron-withdrawing group is an electron-withdrawing group conventionally used in the organic electron theory or the like, and includes, for example, a fluorenyl group, an organic sulfoxydo group, a cyano group, a nitro group, an ester group, a carbonyl group, an amido group and a pyridyl group.

The above-described organic sulfoxydo group includes groups represented by formula (6) shown below.

(6)

In formula (6), Ar represents a substituent, and is preferably an aryl group. Specific examples of the aryl group include a phenyl group, a tolyl group and a naphthyl group. A number of carbon atoms included in Ar is ordinarily from 6 to 18, and preferably from 6 to 12.

The above-described substituent includes an alkyl group preferably having from 1 to 12 carbon atoms, more preferably having from 1 to 6 carbon atoms, a cycloalkyl group preferably having from 5 to 10 carbon atoms, more preferably having from 6 to 8 carbon atoms, an aryl group preferably having from 6 to 14 carbon atoms, more preferably having from 6 to 10 carbon atoms and an aralkyl group preferably having from 7 to 15 carbon atoms, more preferably having from 7 to 11 carbon atoms. Specific examples thereof include a methyl group, an ethyl group, a propyl group, a butyl group, a cyclohexyl group, a phenyl group, a tolyl group, a naphthyl group, a benzyl group, a phenethyl group and a naphthylmethyl group.

The above-described amino group includes an unsubstituted amino group and a substituted amino group. The substituted amino group includes a mono-substituted amino group and a di-substituted amino group. The above-described amino group is represented by formula (7) shown below.

(7)

In formula (7), $R_5$ and $R_6$ each represents a hydrogen atom or a substituent. The substituent has preferably from 1 to 18 carbon atoms, more preferably from 6 to 12 carbon atoms. The substituent includes an alkyl group, a cycloalkyl group, an aryl group and an aralkyl group. The alkyl group has preferably 1 to 12 carbon atoms, more preferably from 2 to 6 carbon atoms, and includes, for example, an ethyl group, a propyl group, a butyl group and a hexyl group. The cycloalkyl group has preferably from 5 to 10 carbon atoms, more preferably from 6 to 8 carbon atoms, and includes, for example, a cyclohexyl group and a cyclooctyl group. The aryl group has preferably from 6 to 14 carbon atoms, more preferably from 6 to 10 carbon atoms, and includes, for example, a phenyl group, a tolyl group and a naphthyl group. The aralkyl group has preferably from 7 to 15 carbon atoms, more preferably from 7 to 11 carbon atoms, and includes, for example, a benzyl group, a phenethyl group and a naphthylmethyl group. The alkyl group, cycloalkyl group, aryl group and aralkyl group may have a substituent. In such a case, the substituent includes an amino group, an alkoxy group, an alkoxycarbonyl group, an acyl group, an acyloxy group and a hydroxy group. In the amino group represented by formula (7), $R_5$ and $R_6$ may be connected with each other to form a nitrogen-containing ring. In such a case, a number of atoms constituting the nitrogen-containing ring is preferably from 3 to 12, more preferably from 5 to 8. The nitrogen-containing ring may include a plurality of hetero atoms (for example, N, O or S) as the ring constituting atom.

In the invention, the amino group preferably includes groups represented by formula (8) shown below.

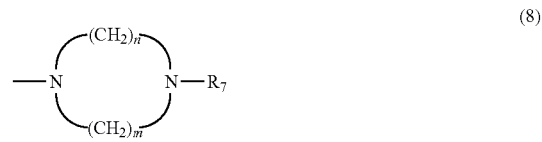

(8)

In formula (8), n and m each preferably represents a number of 1 to 6, more preferably a number of 2 to 4. n+m is preferably from 4 to 12, more preferably from 4 to 8. $R_7$ represents a hydrogen atom or a substituent, for example, a hydrocarbon group, a hydrocarbon oxy group or an acyl group, or may be a residue of the urethane compound having the base propagation function. A number of carbon atoms included in the hydrocarbon group, the hydrocarbon group of the hydrocarbon oxy group or the hydrocarbon group of the acyl group is preferably from 1 to 12, more preferably from 1 to 8. The hydrocarbon group includes an alkyl group, a cycloalkyl group, an aryl group and an aralkyl group.

The urethane compound used as the base propagator may include two or more urethane bonds. Such a urethane compound includes compounds represented by formulae (9) and (10) shown below.

The base generator described above contains a urethane bond, and a carbon atom, which is adjacent to a carbon atom connected to the urethane group (carbamoyl group), has an electron-withdrawing group and a hydrogen atom. Therefore, because of such a structural characteristic, the hydrogen atom connected to the carbon atom having the electron-withdrawing group has an acidic property and is capable of being drawn by the action of a base. The mechanism of the base propagation reaction by the base propagator is described below. First, the drawing of the hydrogen atom by the action of a base occurs and then a carbamic acid is released which is further decomposed to generate a base and carbon dioxide. The base generated on this occasion acts on another molecule of the base propagator to decompose the molecule, thereby generating a base. Thus, the base propagators are decom-

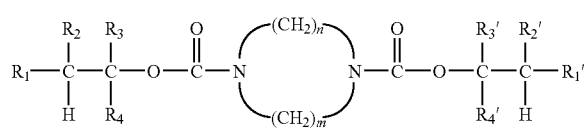

(9)

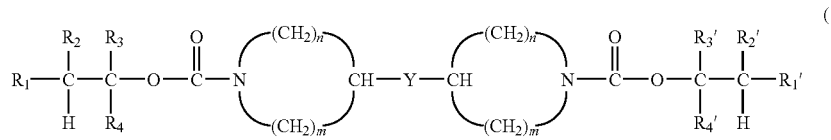

(10)

In formula (9), $R_1$ and $R_2$ each represents a hydrogen atom, a substituent or an electron-withdrawing group, provided that at least one of $R_1$ and $R_2$ is an electron-withdrawing group, $R_3$ and $R_4$ each represents a hydrogen atom or a substituent, $R_1'$ and $R_2'$ each represents a hydrogen atom, a substituent or an electron-withdrawing group, provided that at least one of $R_1'$ and $R_2'$ is an electron-withdrawing group, $R_3'$ and $R_4'$ each represents a hydrogen atom or a substituent, n and m each preferably represents a number of 1 to 6, more preferably a number of 2 to 4, and n+m is preferably from 4 to 12, more preferably from 4 to 8.

In formula (10), $R_1$ and $R_2$ each represents a hydrogen atom, a substituent or an electron-withdrawing group, provided that at least one of $R_1$ and $R_2$ is an electron-withdrawing group, $R_3$ and $R_4$ each represents a hydrogen atom or a substituent, $R_1'$ and $R_2'$ each represents a hydrogen atom, a substituent or an electron-withdrawing group, provided that at least one of $R_1'$ and $R_2'$ is an electron-withdrawing group, $R_3'$ and $R_4'$ each represents a hydrogen atom or a substituent, Y represents an alkylene group having preferably from 1 to 8, more preferably from 2 to 6, n and m each preferably represents a number of 1 to 6, more preferably a number of 2 to 4, and n+m is preferably from 4 to 12, more preferably from 4 to 8.

Specific examples of the electron-withdrawing group and substituent are same as those described with respect to formula (5) above.

posed in a chain reaction and in consequence, a large amount of bases is generated by a small amount of base. The base propagation reaction is illustrated by a reaction formula shown below with respect to the urethane compound represented by formula (5).

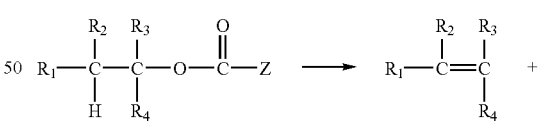

In the above reaction formula, H-Z represents a base resulting from an amino group connected to the urethane bond. The base is ammonia or preferably an amine.

In order to prepare the base propagator, an alcohol is reacted with a chloroformic acid ester to form an asymmetric carbonic diester and then the carbonic diester is reacted with a base.

Specific examples of the base propagator preferably used in the invention are set forth below.
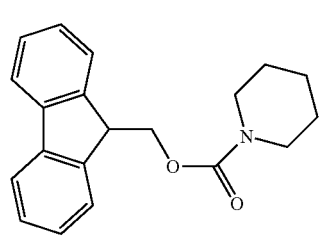 1-1
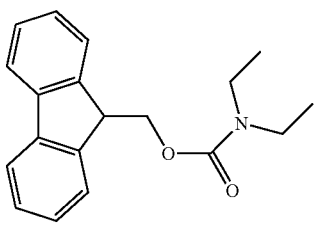 1-2
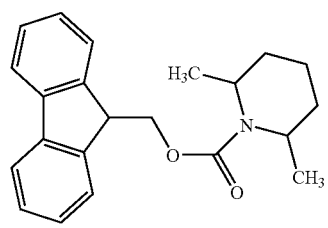 1-3
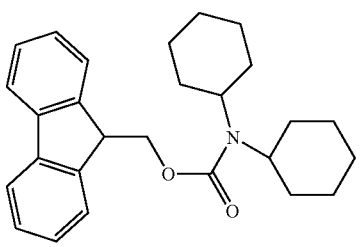 1-4
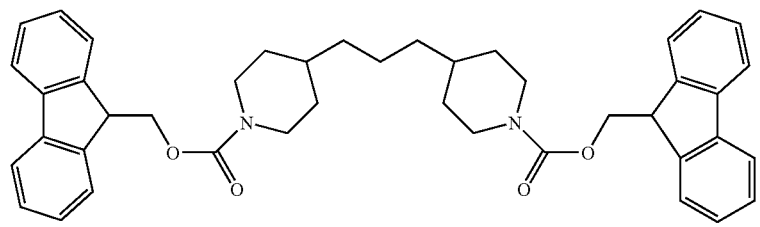 1-5
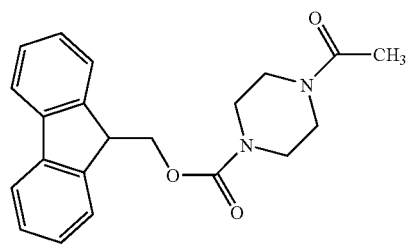 1-6
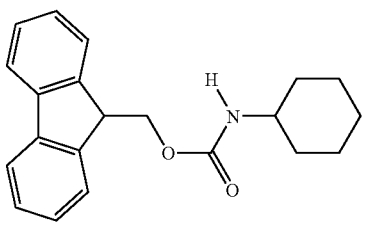 1-7
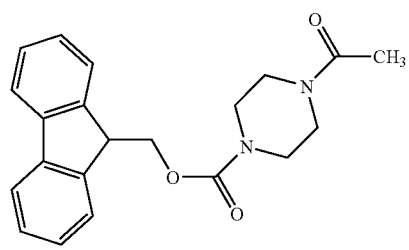 1-8
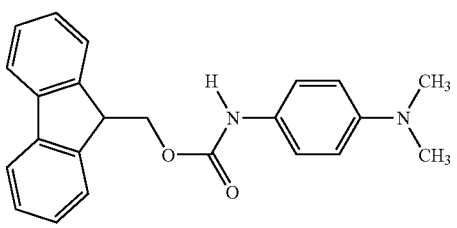 1-9
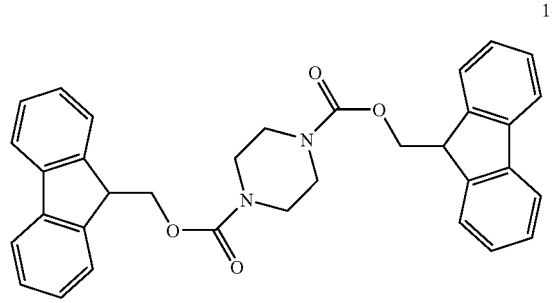 1-10
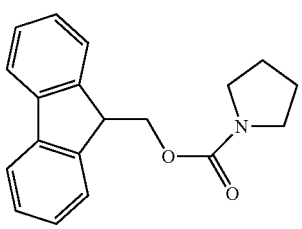 1-11

-continued

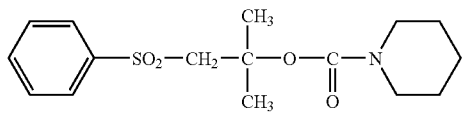

2-1

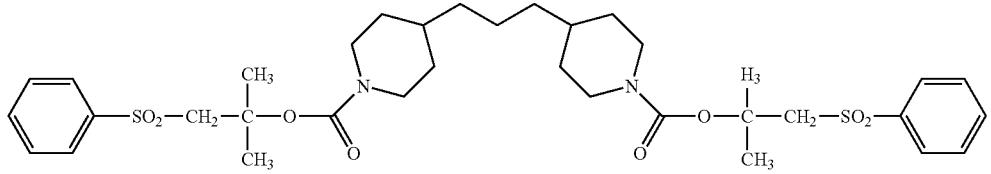

2-2

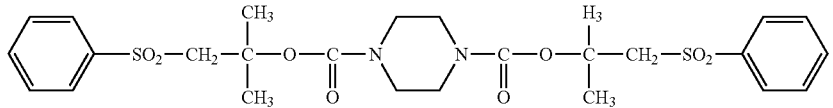

2-3

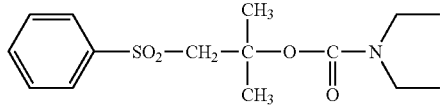

2-4

The compounds of Nos. 1-1 to 1-11 are examples of fluorene type base propagator in which a fluorenyl group is connected as the electron-withdrawing group and which generates amines in a propagating manner. On the other hand, the compounds of Nos. 2-1 to 2-4 are examples of sulfone type base propagator in which an organic sulfoxydo group is connected as the electron-withdrawing group and which generates amines in a propagating manner.

The base propagator is thermally stable at room temperature and can be preserved for a long period of time. When the base propagator is dissolved in an organic solvent and to the solution is added a small amount of a base for causing an initial catalytic reaction to undergo reaction by heating, after a specific reaction period decomposition causes rapidly and thus, it can be confirmed that the base propagation reaction proceeds.

The amount of the base propagator added is preferably from 100 to 10,000 parts by weight, and more preferably from 200 to 9,000 parts by weight, per 100 parts by weight of the base generator in view of laser decomposability.

Although the mechanism of the invention is not quite clear, it is presumed to be as follows. According to the laser engraving of decomposable resin composition, in general, it is believed that a polymer compound or an additive, for example, a dye as described hereinafter absorbs laser light to generate heat and by diffusion of the heat, the polymer or the like undergoes melting, evaporation or decomposition, whereby a concavo-convex image is formed. Since many polymers and crosslinking agents are connected by covalent bonds, their evaporation/decomposition temperatures are high. On the other hand, in the case of using the combination of the polyurethane resin capable of being decomposed with a base and the base generator according to the invention, it is believed that although the decomposition on the upper surface is same as that of conventional resin, in the deep portion with low heat generation, the polyurethane resin is decomposed into a monomer level by depolymerization of the polyurethane resin due to a base generated upon decomposition of the base generator and as a result, the decomposability is increased in comparison with the conventional resin so that high sensitivity can be achieved. It is also believed that both of the sensitivity and the stability at the time of film formation or preservation are achieved by controlling the heat of decomposition of the base generator.

(Other Components)

To the decomposable resin composition according to the invention, other components suitable for the use and production method thereof may further be appropriately added. Preferable examples of the additive are described below.

(Resin)

According to the invention, the polyurethane resin capable of being decomposed with a base described above may be used together with a conventional resin described below. The amount of the resin used together is ordinarily from 1 to 90% by weight, preferably from 5 to 80% by weight, based on the polyurethane resin.

The resin used together may be an elastomer or a non-elastomer.

The number average molecular weight of the resin used together is preferably in a range of 1,000 to 1,000,000, more preferably in a range of 5,000 to 500,000. When the number average molecular weight thereof is in the range of 1,000 to 1,000,000, the mechanical strength of the layer formed can be ensured. The term "number average molecular weigh" as used herein means a molecular weight obtained by measuring using gel permeation chromatography (GPC) and calculating in terms of standard polystyrene of a known molecular weight.

As the resin used together, a resin easily liquefiable or a resin easily decomposable is preferable. The resin easily decomposable preferably contains in the molecular chain as a monomer unit easily decomposable, for example, a monomer unit derived from styrene, α-methylstyrene, a-methoxystyrene, an acryl ester, a methacryl ester, an ester compound, an ether compound, a nitro compound, a carbonate compound, a carbamoyl compound, a hemiacetal ester compound, an oxyethylene compound or an aliphatic cyclic compound. In particular, a polyether, for example, polyethylene glycol, polypropylene glycol or polytetraethylene glycol, an aliphatic polycarbonate, an aliphatic polycarbamate, polymethyl methacrylate, polystyrene, nitrocellulose, polyoxyethylene, polynorbornene, hydrogenated polycyclohexadiene or a polymer having a molecular structure of many branched structures, for example, a dendrimer is the representative example of the resin easily decomposable. Also, a polymer containing a lot of oxygen atoms in the molecular chain is preferable from the standpoint of the decomposability. Among them, the compound having a carbonate group, a carbamate group or a methacryl group in the polymer main chain is preferable in view of the high heat decomposability. For instance, a polyester or polyurethane synthesized using as the raw material, (poly)carbonatediol or (poly)carbonate dicarboxylic acid or a polyamide synthesized using as the raw material, (poly)carbonate diamine is illustrated as a preferable example of the polymer of good heat decomposability. The polymer may contain a polymerizable unsaturated group in the main chain or side chain thereof. In particular, when the polymer has a reactive functional group, for example, a hydroxy group, an amino group or a carboxyl group at the terminal, it is easy to introduce the polymerizable unsaturated group.

The thermoplastic elastomer is not particularly restricted and includes, for example, a urethane-series thermoplastic elastomer, an ester-series thermoplastic elastomer, an amide-series thermoplastic elastomer or a silicone-series thermoplastic elastomer. In order to more increase the heat decomposability, a polymer wherein an easily decomposable functional group, for example, a carbamoyl group or a carbonate group is introduced into its main chain can be used. Also, it may be used as a mixture with a polymer of higher heat decomposability. Since the thermoplastic elastomer is fluidized by heating, it is possible to mix with the complex for use in the invention. The term "thermoplastic elastomer" as used herein means a material which exhibits rubber elasticity at ambient temperature and is fluidized by heating to undergo fabrication as an ordinary thermoplastic plastic. With respect to the molecular structure, the thermoplastic elastomer comprises a soft segment like a polyether or a rubber molecule and a hard segment which prevents plastic deformation around ambient temperature as vulcanized rubber. As the hard segment, various types, for example, a frozen phase, a crystalline phase, a hydrogen bond or an ionic crosslinkage are present.

The kind of thermoplastic elastomer can be selected depending on the use of the resin composition. For instance, in the field requiring solvent resistance, a urethane-series, ester-series, amide-series or fluorine-series thermoplastic elastomer is preferable and in the field requiring heat resistance, a urethane-series, olefin-series, ester-series or fluorine-series thermoplastic elastomer is preferable. Further, the hardness can be widely changed depending on the kind of thermoplastic elastomer.

The non-elastomeric thermoplastic resin is not particularly restricted and includes, for example, a polyester resin, an unsaturated polyester resin, a polyamide resin, a polyamide-imide resin, a polyurethane resin, an unsaturated polyurethane resin, a polysulfone resin, a polyethersulfone resin, a polyimide resin, a polycarbonate resin and a full aromatic polyester resin.

A hydrophilic polymer may be used as the resin used together. The hydrophilic polymer includes, for example, a hydrophilic polymer containing hydroxyethylene as a constituting unit. Specifically, polyvinyl alcohol, a vinyl alcohol/vinyl acetate copolymer (partially saponified polyvinyl alcohol) and a modified product thereof are exemplified. The hydrophilic polymers may be used individually or in combination of two or more thereof. Examples of the modified product include a polymer wherein at least a part of hydroxy groups are modified to carboxyl groups, a polymer wherein at least a part of hydroxy groups are modified to (meth)acryloyl groups, a polymer wherein at least a part of hydroxy groups are modified to amino groups, and a polymer having ethylene glycol, propylene glycol or a dimer thereof introduced into its side chain.

The polymer wherein at least a part of hydroxy groups are modified to carboxyl groups can be obtained by esterification of polyvinyl alcohol or partially saponified polyvinyl alcohol with a polyfunctional carboxylic acid, for example, succinic acid, maleic acid or adipic acid.

The polymer wherein at least a part of hydroxy groups are modified to (meth)acryloyl groups can be obtained by addition of a glycidyl group-containing ethylenically unsaturated monomer to the above-described carboxyl group-modified polymer or by esterification of polyvinyl alcohol or partially saponified polyvinyl alcohol with (meth)acrylic acid.

The polymer wherein at least a part of hydroxy groups are modified to amino groups can be obtained by esterification of polyvinyl alcohol or partially saponified polyvinyl alcohol with a carboxylic acid containing an amino group, for example, carbamic acid.

The polymer having ethylene glycol, propylene glycol or a dimer thereof introduced into its side chain can be obtained by heating polyvinyl alcohol or partially saponified polyvinyl alcohol together with a glycol in the presence of a sulfuric acid catalyst and removing water as a byproduct from the reaction system.

Of the hydrophilic polymers, the polymer wherein at least a part of hydroxy groups are modified to (meth)acryloyl groups is particularly preferably used. This is because by the direct introduction of an unreacted crosslinkable functional group to a polymer component, strength of the layer formed can be increased so that both flexibility and strength of the layer formed can be achieved.

The weight average molecular weight (measured by GPC and calculated in terms of polystyrene) of the hydrophilic polymer is preferably from 10,000 to 500,000. When the weight average molecular weight is 10,000 or more, the polymer is excellent in the configuration retention property as a resin alone. When the weight average molecular weight is 500,000 or less, the polymer is easily soluble in a solvent, for example, water and advantageous to the preparation of a crosslinkable resin composition.

Further, the resin used together may be a solvent-soluble resin. Specific examples thereof include a polysulfone resin, a polyethersulfone resin, an epoxy resin, an alkyd resin, a polyolefin resin and a polyester resin.

The resin used together does not ordinarily have a polymerizable unsaturated group having a high reactivity. However, it may have the polymerizable unsaturated group having a high reactivity at the terminal of the molecular chain or in the side chain. When a polymer having the polymerizable unsaturated group having a high reactivity, for example, a methacryloyl group is used, a layer having the extremely high mechanical strength can be prepared. In particular, as for the polyurethane-series or polyester-series thermoplastic elastomer, the polymerizable unsaturated group having a high reactivity can be introduced into the molecule thereof with comparative ease. The terminology "be introduced into the molecule" as used herein means and includes cases wherein the polymerizable unsaturated group is directly bonded at both terminals or one terminal of the polymer main chain, at a terminal of the polymer side chain, or in the polymer main chain or side chain. Specifically, for instance, the resin having the polymerizable unsaturated group directly introduced at the terminal of molecule may be used. Alternatively, other method, for example, a method is preferably employed in which a compound having a molecular weight of about several thousands and including plural reactive groups, for example, a hydroxy group, an amino group, an epoxy group, a carboxyl group, an acid anhydride group, a ketone group, a hydrazine residue, an isocyanate group, an isothiocyanate group, a cyclic carbonate group or an ester group is reacted with a bonding agent (for example, a polyisocyanate group reacting with a hydroxy group or amino group) having a group capable of connecting with the reactive group of the above compound to conduct the adjustment of molecular weight and conversion to a terminal bonding group and then the resulting compound is reacted with an organic compound having a group capable of reacting with the terminal bonding group and a polymerizable unsaturated group to introduce the polymerizable unsaturated group into the terminal.

The decomposable resin composition according to the invention may contain (D) a polymerizable compound (monomer), an initiator and other components, if desired. The polymerizable compound (monomer), initiator and other components will be described hereinafter.

Polymerizable Compound (Monomer)

The polymerizable compound (monomer) is described in greater detail below taking a case wherein an addition polymerizable compound is used as an example.

<Addition Polymerizable Compound>

The addition-polymerizable compound having at least one ethylenically unsaturated double bond which is the polymerizable compound preferably used in the invention is selected from compounds having at least one, preferably two or more, terminal ethylenically unsaturated double bonds. Such compounds are widely known in the field of art and they can be used in the invention without any particular limitation. The compound has a chemical form, for example, a monomer, a prepolymer, specifically, a dimer, a trimer or an oligomer, or a copolymer thereof, or a mixture thereof. Examples of the monomer include unsaturated carboxylic acids (for example, acrylic acid, methacrylic acid, itaconic acid, crotonic acid, isocrotonic acid or maleic acid) and esters or amides thereof. Preferably, esters of an unsaturated carboxylic acid with an aliphatic polyhydric alcohol compound and amides of an unsaturated carboxylic acid with an aliphatic polyvalent amine compound are used. An addition reaction product of an unsaturated carboxylic acid ester or amide having a nucleophilic substituent, for example, a hydroxy group, an amino group or a mercapto group, with a monofunctional or polyfunctional isocyanate or epoxy, or a dehydration condensation reaction product of the unsaturated carboxylic acid ester or amide with a monofunctional or polyfunctional carboxylic acid is also preferably used. Furthermore, an addition reaction product of an unsaturated carboxylic acid ester or amide having an electrophilic substituent, for example, an isocyanato group or an epoxy group with a monofunctional or polyfunctional alcohol, amine or thiol, or a substitution reaction product of an unsaturated carboxylic acid ester or amide having a releasable substituent, for example, a halogen atom or a tosyloxy group with a monofunctional or polyfunctional alcohol, amine or thiol is also preferably used. In addition, compounds in which the unsaturated carboxylic acid described above is replaced by an unsaturated phosphonic acid, styrene, vinyl ether or the like can also be used.

Specific examples of the monomer, which is an ester of an aliphatic polyhydric alcohol compound with an unsaturated carboxylic acid, include acrylic acid esters, for example, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate or polyester acrylate oligomer;

methacrylic acid esters, for example, tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane or bis[p-(methacryloxyethoxy)phenyl]dimethylmethane;

itaconic acid esters, for example, ethylene glycol diitaconate, propylene glycol diitaconate, 1,3-butanediol diitaconate, 1,4-butanediol diitaconate, tetramethylene glycol diitaconate, pentaerythritol diitaconate or sorbitol tetraitaconate;

crotonic acid esters, for example, ethylene glycol dicrotonate, tetramethylene glycol dicrotonate, pentaerythritol dicrotonate or sorbitol tetracrotonate;

isocrotonic acid esters, for example, ethylene glycol diisocrotonate, pentaerythritol diisocrotonate or sorbitol tetraisocrotonate; and maleic acid esters, for example, ethylene glycol dimaleate, triethylene glycol dimaleate, pentaerythritol dimaleate and sorbitol tetramaleate.

Other examples of the ester, which can be preferably used, include aliphatic alcohol esters described in JP-B-46-27926 (the term "JP-B" as used herein means an "examined Japanese patent publication"), JP-B-51-47334 and JP-A-57-196231, esters having an aromatic skeleton described in JP-A-59-5240, JP-A-59-5241 and JP-A-2-226149, and esters containing an amino group described in JP-A-1-165613.

The above-described ester monomers can also be used as a mixture.

Specific examples of the monomer, which is an amide of an aliphatic polyvalent amine compound with an unsaturated carboxylic acid, include methylene bisacrylamide, methylene bismethacrylamide, 1,6-hexamethylene bisacrylamide, 1,6-hexamethylene bismethacrylamide, diethylenetriamine trisacrylamide, xylylene bisacrylamide and xylylene bismethacrylamide.

Other preferable examples of the amide monomer include amides having a cyclohexylene structure described in JP-B-54-21726.

Urethane type addition polymerizable compounds produced using an addition reaction between an isocyanate and a hydroxy group are also preferably used, and specific examples thereof include vinylurethane compounds having two or more polymerizable vinyl groups per molecule obtained by adding a vinyl monomer containing a hydroxy group represented by formula (V) shown below to a polyisocyanate compound having two or more isocyanate groups per molecule, described in JP-B-48-41708.

$$CH_2=C(R)COOCH_2CH(R')OH \qquad (V)$$

wherein R and R' each independently represents H or $CH_3$.

Also, urethane acrylates described in JP-A-51-37193, JP-B-2-32293 and JP-B-2-16765, and urethane compounds having an ethylene oxide skeleton described in JP-B-58-49860, JP-B-56-17654, JP-B-62-39417 and JP-B-62-39418 are preferably used.

Furthermore, the resin composition capable of being cured at short times can be obtained by using an addition polymerizable compound having an amino structure or a sulfide structure in its molecule described in JP-A-63-277653, JP-A-63-260909 and JP-A-1-105238.

Other examples include polyfunctional acrylates and methacrylates, for example, polyester acrylates and epoxy acrylates obtained by reacting an epoxy resin with acrylic acid or methacrylic acid described in JP-A-48-64183, JP-B-49-43191 and JP-B-52-30490. Specific unsaturated compounds described in JP-B-46-43946, JP-B-1-40337 and JP-B-1-40336, and vinylphosphonic acid series compounds described in JP-A-2-25493 can also be exemplified. In some cases, structure containing a perfluoroalkyl group described in JP-A-61-22048 can be preferably used. Moreover, photocurable monomers or oligomers described in *Nippon Secchaku Kyokaishi (Journal of Japan Adhesion Society)*, Vol. 20, No. 7, pages 300 to 308 (1984) can also be used.

In view of the photo-speed, a structure having a large content of unsaturated groups per molecule is preferred and in many cases, a difunctional or more functional compound is preferred. In order to increase the strength of image area, that is, hardened layer, a trifunctional or more functional compound is preferred. A combination use of compounds different in the functional number or in the kind of polymerizable group (for example, an acrylic acid ester, a methacrylic acid ester, a styrene compound or a vinyl ether compound) is an effective method for controlling both the sensitivity and the strength. The polymerizable compound is preferably used in an amount from 5 to 80% by weight, more preferably from 25 to 75% by weight, based on the total content of nonvolatile components in the resin composition. The polymerizable compounds may be used individually or in combination of two or more thereof.

Before and/or after the laser decomposition, the laser-decomposable resin composition containing the polymerizable compound can be polymerized and cured by energy, for example, light or heat.

<Initiator>

As the initiator, initiators known to those skilled in the art can be used without limitation. Specifically, many compounds described in literature, for example, Bruce M. Monroe et al., *Chemical Review*, 93, 435 (1993), R. S. Davidson, *Journal of Photochemistry and Biology A: Chemistry*, 73, 81 (1993), J. P. Faussier, *Photoinitiated Polymerization-Theory and Applications: Rapra Review*, Vol. 9, Report, Rapra Technology (1998) or M. Tsunooka et al., *Prog. Polym. Sci.*, 21, 1 (1996) can be used. Further, a group of compounds undergoing oxidative or reductive bond cleavage as described, for example, in F. D. Saeva, *Topics in Current Chemistry*, 156, 59 (1990), G. G. Maslak, *Topics in Current Chemistry*, 168, 1 (1993), H. B. Shuster et al., *JACS*, 112, 6329 (1990) and I. D. F. Eaton et al., *JACS*, 102, 3298 (1980) are known.

With respect to specific examples of preferable initiator, a radical initiator which is a compound that generates a radical upon light energy and/or heat energy and initiates or promotes a polymerization reaction of the above-described polymerizable compound is described in greater detail below, but the invention should not be construed as being limited thereto.

As the radical initiator preferably used in the invention, (a) an aromatic ketone, (b) an onium salt compound, (c) an organic peroxide, (d) a thio compound, (e) a hexaarylbiimidazole compound, (f) a ketoxime ester compound, (g) a borate compound, (h) an azinium compound, (i) a metallocene compound, (j) an active ester compound, (k) a compound having a carbon-halogen bond and (l) an azo series compound. Specific examples of the compounds of (a) to (l) are set forth below, but the invention should not be construed as being limited thereto.

(a) Aromatic Ketone

The aromatic ketone (a) preferably used as the radical initiator in the invention includes compounds having a benzophenone skeleton or a thioxanthone skeleton described in J. P. Fouassier and J. F. Rabek, *Radiation Curing in Polymer Science and Technology*, pages 77 to 117 (1993). For example, the following compounds are recited.

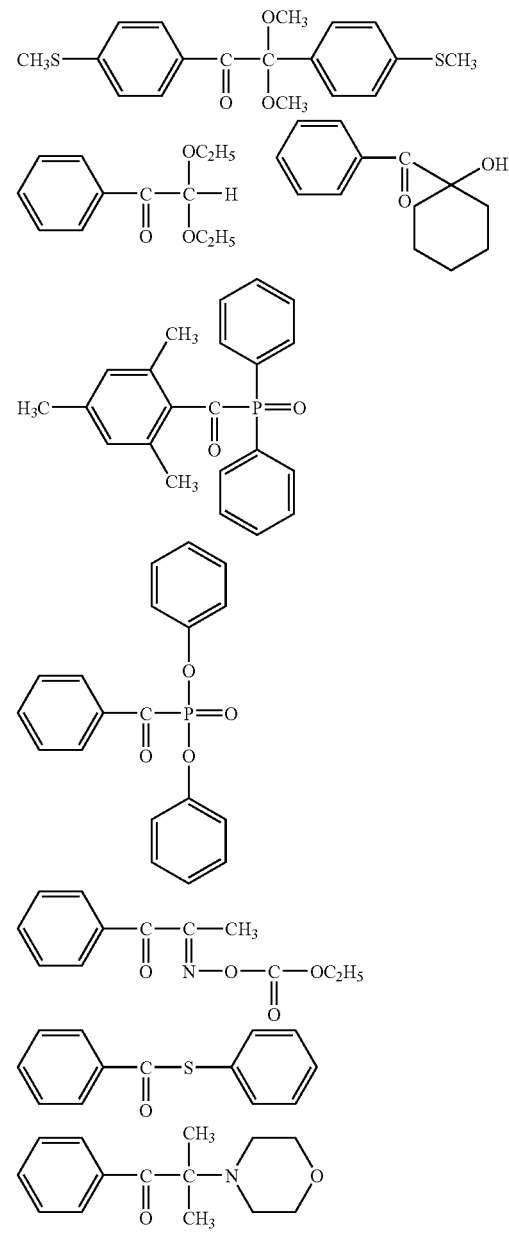

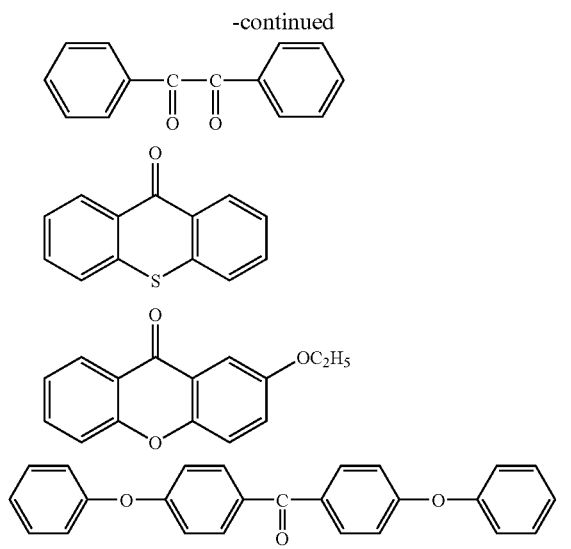

Among them, particularly preferable examples of the aromatic ketone (a) include the following compound:

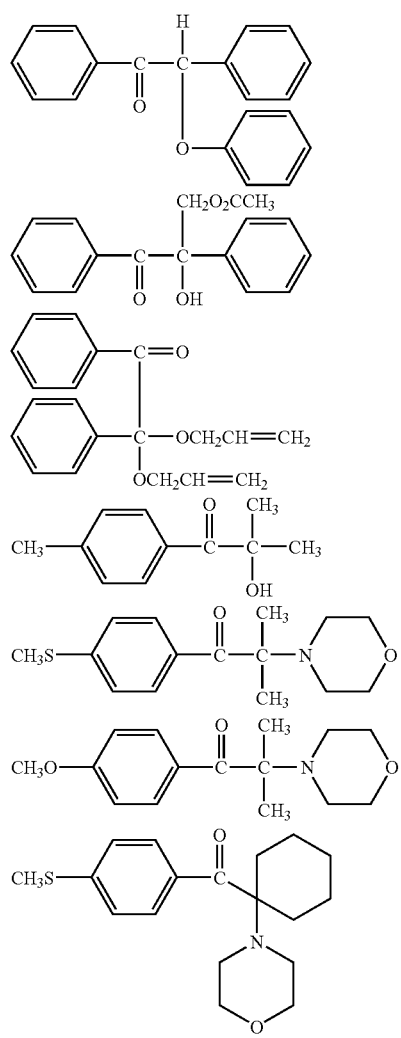

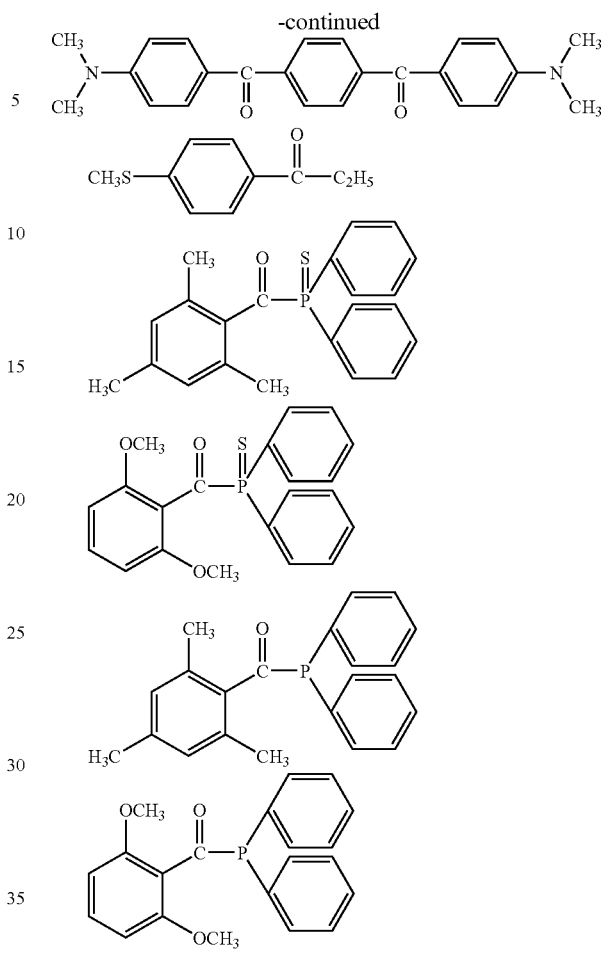

(b) Onium Salt Compound

The onium salt compound (b) preferably used as the radical initiator in the invention includes compounds represented by the following formulae (1) to (3):

$$Ar^1\text{—}I^+\text{—}Ar^2 \quad (Z^2)^- \qquad \text{Formula (1)}$$

$$Ar^3\text{—}N^+\!\!\equiv\!\!N \quad (Z^3)^- \qquad \text{Formula (2)}$$

$$\begin{array}{c} R_{23} \\ \phantom{R_{23}}\diagdown \\ \phantom{R_{23}\diagdown}\text{S}^+\text{—}R^{25} \quad (Z^4)^- \\ \phantom{R_{23}}\diagup \\ R^{24} \end{array} \qquad \text{Formula (3)}$$

In formula (1), $Ar^1$ and $Ar^2$ each independently represent an aryl group having not more than 20 carbon atoms, which may have a substituent. $(Z^2)^-$ represents a counter ion selected from the group consisting of a halogen ion, a perchlorate ion, a carboxylate ion, tetrafluoroborate ion, a hexafluorophosphate ion and a sulfonate ion, and is preferably a perchlorate ion, a hexafluorophosphate ion and an arylsulfonate ion.

In formula (2), $Ar^3$ represents an aryl group having not more than 20 carbon atoms, which may have a substituent. $(Z^3)^-$ represents a counter ion having the same meaning as defined for $(Z^2)^-$.

In formula (3), $R^{23}$, $R^{24}$ and $R^{25}$, which may be the same or different, each represent a hydrocarbon group having not more than 20 carbon atoms, which may have a substituent. $(Z^4)^-$ represents a counter ion having the same meaning as defined for $(Z^2)^{31}$.

Specific examples of the onium salt preferably used in the invention include those described in Paragraph Nos. [0030] to [0033] of JP-A-2001-133969 and Paragraph Nos. [0015] to [0046] of JP-A-2001-343742, and specific aromatic sulfonium salt compounds described in JP-A-2002-148790, JP-A-2001-343742, JP-A-2002-6482, JP-A-2002-116593 and JP-A-2004-102031 both of which the applicant has been previously proposed.

(c) Organic Peroxide

The organic peroxide (c) preferably used as the radical initiator in the invention includes almost all organic compounds having at least one oxygen-oxygen bond in the molecules thereof. Specific examples of the organic peroxide include methyl ethyl ketone peroxide, cyclohexanone peroxide, 3,3,5-trimethylcyclohexanone peroxide, methylcyclohexanone peroxide, acetylacetone peroxide, 1,1-bis(tert-butylperoxy)-3,3,5-trimethylcyclohexane, 1,1-bis(tert-butylperoxy)cyclohexane, 2,2-bis(tert-butylperoxy)butane, tert-butylhydroperoxide, cumene hydroperoxide, diisopropylbenzene hydroperoxide, paramethane hydroperoxide, 2,5-dimethylhexane-2,5-dihydroperoxide, 1,1,3,3-tetramethylbutyl hydroperoxide, di-tert-butyl peroxide, tert-butyl cumyl peroxide, dicumyl peroxide, bis(tert-butylperoxyisopropyl)benzene, 2,5-dimethyl-2,5-di(tert-butylperoxy)hexane, 2,5-xanoyl peroxide, succinic peroxide, benzoyl peroxide, 2,4-dichlorobenzoyl peroxide, methatoluoyl peroxide, diisopropylperoxy dicarbonate, di-2-ethylhexylperoxy dicarbonate, di-2-ethoxyethylperoxy dicarbonate, dimethoxyisopropylperoxy dicarbonate, di(3-methyl-3-methoxybutyl)peroxy dicarbonate, tert-butylperoxy acetate, tert-butylperoxy pivalate, tert-butylperoxy neodecanoate, tert-butylperoxy octanoate, tert-butylperoxy 3,5,5-trimethylhexanoate, tert-butylperoxy laurate, tertiary carbonate, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, carbonyl di(tert-butylperoxydihydrogen diphthalate) and carbonyl di(tert-hexylperoxydihydrogen diphthalate).

Among them, peroxy ester compounds, for example, 3,3',4,4'-tetra(tert-butylperoxycarbonyl)benzophenone, 3,3',4,4'-tetra(tert-amylperoxycarbonyl)benzophenone, 3,3',4,4'-tetra(tert-hexylperoxycarbonyl)benzophenone, 3,3',4,4'-tetra(tert-octylperoxycarbonyl)benzophenone, 3,3',4,4'-tetra(cumylperoxycarbonyl)benzophenone, 3,3',4,4'-tetra(p-isopropylcumylperoxycarbonyl)benzophenone and di-tert-butyldiperoxy isophthalate are preferred.

(d) Thio Compound

The thio compound (d) preferably used as the radical initiator in the invention includes compounds having the structure represented by the following formula (4):

Formula (4)

$$R^{26}-NH \qquad R^{26}-N$$
$$\underset{R^{27}-C=S}{\quad} \text{ or } \underset{R^{27}-C-SH}{\quad}$$

In formula (4), $R^{26}$ represents an alkyl group, an aryl group or a substituted aryl group. $R^{27}$ represents a hydrogen atom or an alkyl group. Alternatively, $R^{26}$ and $R^{27}$ combine with each other and together represent a non-metallic atomic group necessary for forming a 5-membered, 6-membered or 7-membered ring, which may contain a hetero atom selected from an oxygen atom, a sulfur atom and a nitrogen atom.

Specific examples of the thio compound represented by formula (4) include the following compounds:

| No. | $R^{26}$ | $R^{27}$ |
|---|---|---|
| 1 | —H | —H |
| 2 | —H | —CH$_3$ |
| 3 | —CH$_3$ | —H |
| 4 | —CH$_3$ | —CH$_3$ |
| 5 | —C$_6$H$_5$ | —C$_2$H$_5$ |
| 6 | —C$_6$H$_5$ | —C$_4$H$_9$ |
| 7 | —C$_6$H$_4$Cl | —CH$_3$ |
| 8 | —C$_6$H$_4$Cl | —C$_4$H$_9$ |
| 9 | —C$_6$H$_4$—CH$_3$ | —C$_4$H$_9$ |
| 10 | —C$_6$H$_4$—OCH$_3$ | —CH$_3$ |
| 11 | —C$_6$H$_4$—OCH$_3$ | —C$_2$H$_5$ |
| 12 | —C$_6$H$_4$—OC$_2$H$_5$ | —CH$_3$ |
| 13 | —C$_6$H$_4$—OC$_2$H$_5$ | —C$_2$H$_4$ |
| 14 | —C$_6$H$_4$—OCH$_3$ | —C$_4$H$_9$ |
| 15 | —(CH$_2$)$_2$— | |
| 16 | —(CH$_2$)$_2$—S— | |
| 17 | —CH(CH$_3$)—CH$_2$—S— | |
| 18 | —CH$_2$—CH(CH$_3$)—S— | |
| 19 | —C(CH$_3$)$_2$—CH$_2$—S— | |
| 20 | —CH$_2$—C(CH$_3$)$_2$—S— | |
| 21 | —(CH$_2$)$_2$—O— | |
| 22 | —CH(CH$_3$)—CH$_2$—O— | |
| 23 | —C(CH$_3$)$_2$—CH$_2$—O— | |
| 24 | —CH=CH—N(CH$_3$)— | |
| 25 | —(CH$_2$)$_3$—S— | |
| 26 | —(CH$_2$)$_2$—CH(CH$_3$)—S— | |
| 27 | —(CH$_2$)$_3$—O— | |
| 28 | —(CH$_2$)$_5$— | |
| 29 | —C$_6$H$_4$—O— | |
| 30 | —N=C(SCH$_3$)—S— | |
| 31 | —C$_6$H$_4$—NH— | |
| 32 | 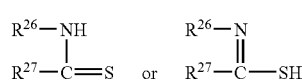 | |

(e) Hexaarylbiimidazole Compound

The hexaarylbiimidazole compound (e) preferably used as the radical initiator in the invention includes lophine dimers described in JP-B-45-37377 and JP-B-44-86516, specifically, for example, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole and 2,2'-bis(o-trifluoromethylphenyl)-4,4',5,5'-tetraphenylbiimidazole.

(f) Ketoxime Ester Compound

The ketoxime ester compound (f) preferably used as the radical initiator in the invention includes, for example, 3-benzoyloxyiminobutan-2-one, 3-acetoxyiminobutan-2-one, 3-propyonyloxyiminobutan-2-one, 2-acetoxyiminopentan-3-one, 2-acetoxyimino-1-phenylpropan-1-one, 2-benzoyloxyimino-1-phenylpropan-1-one, 3-p-toluenesulfonyloxyiminobutan-2-one and 2-ethoxycarbonyloxyimino-1-phenylpropan-1-one.

(g) Borate Compound

The borate compound (g) preferably used as the radical initiator in the invention includes compounds represented by the following formula (5):

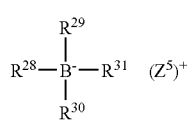

Formula (5)

In formula (5), $R^{28}$, $R^{29}$, $R^{30}$ and $R^{31}$, which may be the same or different, each represents a substituted or unsubstituted alkyl group, a substituted or unsubstituted aryl group, a substituted or unsubstituted alkenyl group, a substituted or unsubstituted alkynyl group or a substituted or unsubstituted heterocyclic group, or at least two of $R^{28}$, $R^{29}$, $R^{30}$ and $R^{31}$ may be combined with each other to form a cyclic structure, provided that at least one of $R^{28}$, $R^{29}$, $R^{30}$ and $R^{31}$ represents a substituted or unsubstituted alkyl group. $(Z^5)^+$ represents an alkali metal cation or a quaternary ammonium cation.

Specific examples of the compound represented by formula (5) include compounds described in U.S. Pat. Nos. 3,567,453 and 4,343,891, European Patents 109,772 and 109,773, and the following compounds:

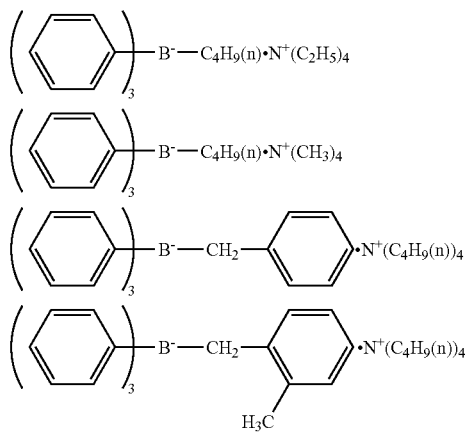

(h) Azinium Compound

The azinium compound (h) preferably used as the radical initiator in the invention includes compounds having an N—O bond described in JP-A-63-138345, JP-A-63-142345, JP-A-63-142346, JP-A-63-143537 and JP-B-4642363.

(i) Metallocene Compound

The metallocene compound (i) preferably used as the radical initiator in the invention includes titanocene compounds described in JP-A-59-152396, JP-A-61-151197, JP-A-63-41484, JP-A-2-249 and JP-A-2-4705, and iron-arene complexes described in JP-A-1-304453 and JP-A-1-152109.

Specific examples of the titanocene compound include dicyclopentadienyl-Ti-dichloride, dicyclopentadienyl-Ti-biphenyl, dicyclopentadienyl-Ti-bis-2,3,4,5,6-pentafluorophen-1-yl, dicyclopentadienyl-Ti-bis-2,3,5,6-tetrafluorophen-1-yl, dicyclopentadienyl-Ti-bis-2,4,6-trifluorophen-1-yl, dicyclopentadienyl-Ti-bis-2,6-difluorophen-1-yl, dicyclopentadienyl-Ti-bis-2,4-difluorophen-1-yl, dimethylcyclopentadienyl-Ti-bis-2,3,4,5,6-pentafluorophen-1-yl, dimethylcyclopentadienyl-Ti-bis-2,3,5,6-tetrafluorophen-1-yl, dimethylcyclopentadienyl-Ti-bis-2,4-difluorophen-1-yl, bis(cyclopentadienyl)bis[2,6-difluoro-3-(pyr-1-yl)phenyl]titanium, bis(cyclopentadienyl)bis[2,6-difluoro-3-(methylsulfonamido)phenyl]titanium bis(cyclopentadienyl)bis[2,6-difluoro-3-(N-butylpivaloylamino)phenyl]titanium, bis(cyclopentadienyl)bis[2,6-difluoro-3-(N-butyl-(4-chlorobenzoyl)amino)phenyl]titanium, bis(cyclopentadienyl)bis[2,6-difluoro-3-(N-benzyl-2,2-dimethylpentanoylamino)phenyl]titanium, bis(cyclopentadienyl)bis[2,6-difluoro-3-(N-(2-ethylhexyl)-4-tolylsulfonylamino)phenyl]titanium, bis(cyclopentadienyl)bis[2,6-difluoro-3-(N-(3-oxaheptyl)benzoylamino)phenyl]titanium, bis(cyclopentadienyl)bis[2,6-difluoro-3-(N-(3,6-dioxadecyl)benzoylamino)phenyl]titanium, bis(cyclopentadienyl)bis[2,6-difluoro-3-(trifluoromethylsulfonylamino)phenyl]titanium, bis(cyclopentadienyl)bis[2,6-difluoro-3-(trifluoroacetylamino)phenyl]titanium, bis(cyclopentadienyl)bis[2,6-difluoro-3-(2-chlorobenzoylamino)phenyl]titanium, bis(cyclopentadienyl)bis[2,6-difluoro-3-(4-chlorobenzoylamino)phenyl]titanium, bis(cyclopentadienyl)bis[2,6-difluoro-3-(N-(3,6-dioxadecyl)-2,2-dimethylpentanoylamino)phenyl]titanium, bis(cyclopentadienyl)bis[2,6-difluoro-3-(N-(3,7-dimethyl-7-methoxyoctyl)benzoylamino)phenyl]titanium and bis(cyclopentadienyl)bis[2,6-difluoro-3-(N-cyclohexylbenzoylamino)phenyl]titanium.

(j) Active Ester Compound

The active ester compound (j) preferably used as the radical initiator in the invention includes imidosulfonate compounds described in JP-B-62-6223, and active sulfonates described in JP-B-63-14340 and JP-A-59-174831.

(k) Compound Having a Carbon-Halogen Bond

The compound having a carbon-halogen bond (k) preferably used as the radical initiator in the invention includes the compounds represented by the following formulae (6) to (12):

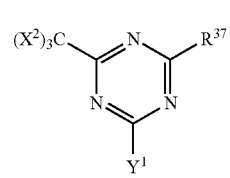

Formula (6)

In formula (6), $X^2$ represents a halogen atom, $Y^1$ represents $—C(X^2)_3$, $—NH_2$, $—NHR^{38}$, $—N(R^{38})_2$ or $—OR^{38}$, $R^{38}$ represents an alkyl group, a substituted alkyl group, an aryl group or a substituted aryl group, and $R^{37}$ represents $—C(X^2)_3$, an alkyl group, a substituted alkyl group, an aryl group, a substituted aryl group or a substituted alkenyl group.

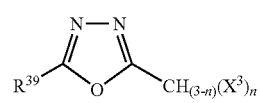

Formula (7)

In formula (7), $R^{39}$ represents an alkyl group, a substituted alkyl group, an alkenyl group, a substituted alkenyl group, an aryl group, a substituted aryl group, a halogen atom, an alkoxy group, a substituted alkoxy group, a nitro group or a cyano group, $X^3$ represents a halogen atom, and n represents an integer of 1 to 3.

$$R^{40}\text{-}Z^6\text{-}CH_{(2-m)}(X^3)_m R^{41}$$ Formula (8):

In formula (8), $R^{40}$ represents an aryl group or a substituted aryl group, $R^{41}$ represents a group shown below or a halogen atom, $Z^6$ represents —C(=O)—, —C(=S)— or —SO$_2$—, $X^3$ represents a halogen atom, and m represents 1 or 2.

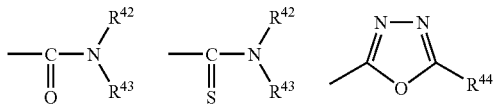

wherein $R^{42}$ and $R^{43}$ each represents an alkyl group, a substituted alkyl group, an alkenyl group, a substituted alkenyl group, an aryl group or a substituted aryl group, and $R^{44}$ has the same meaning as defined for $R^{38}$ in formula (6).

Formula (9)

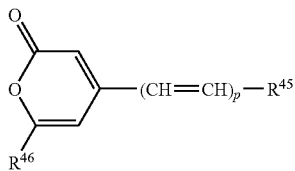

In formula (9), $R^{45}$ represents an aryl group which may be substituted or a heterocyclic group which may be substituted, $R^{46}$ represents a trihaloalkyl group or trihaloalkenyl group each having from 1 to 3 carbon atoms, and p represents 1, 2 or 3.

Formula (10)

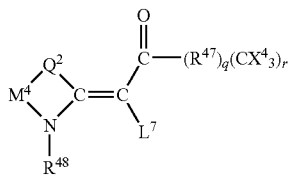

In formula (10), which represents a carbonylmethylene heterocyclic compound having a trihalogenomethyl group, $L^7$ represents a hydrogen atom or a group represented by formula —CO—$(R^{47})_q(C(X^4)_3)_r$, Q represents a sulfur atom, a selenium atom, an oxygen atom, a dialkylmethylene group, an alken-1,2-ylene group, a 1,2-phenylene group or —N(—$R^{48}$)—, $M^4$ represents a substituted or unsubstituted alkylene group, a substituted or unsubstituted alkenylene group or a 1,2-arylene group, $R^8$ represents an alkyl group, an aralkyl group or an alkoxyalkyl group, $R^{47}$ represents a divalent carbocyclic or heterocyclic aromatic group, $X^4$ represents a chlorine atom, a bromine atom or an iodine atom, q represents 0 or 1, and r represents 1 or 2, provided that when q represents 0, r represents 1, and when q represents 1, r represents 1 or 2.

Formula (11)

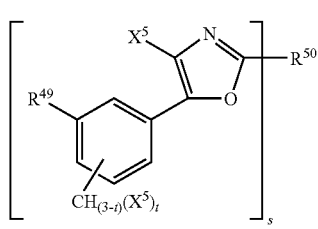

In formula (11), which represents a 4-halogeno-5-(halogenomethylphenyl)oxazole derivative, $X^5$ represents a halogen atom, t represents an integer of 1 to 3, s represents an integer of 1 to 4, $R^{49}$ represents a hydrogen atom or —CH$_{3-t}$X$^5{}_t$, and $R^{50}$ represents an s-valent unsaturated organic residue, which may be substituted.

Formula (12)

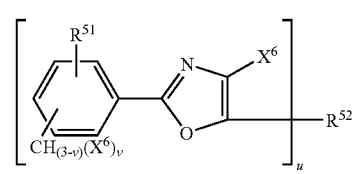

In formula (12), which represents a 2-(halogenomethylphenyl)-4-halogenooxazole derivative, $X^6$ represents a halogen atom, v represents an integer of 1 to 3, u represents an integer of 1 to 4, $R^{51}$ represents a hydrogen atom or —CH$_{3-v}$X$^6{}_v$, and $R^{52}$ represents an u-valent unsaturated organic residue, which may be substituted.

Specific examples of the compound having a carbon-halogen bond include compounds described in Wakabayashi et al., *Bull. Chem. Soc. Japan*, Vol. 42,2924 (1969), for example, 2-phenyl-4,6-bis(trichloromethyl)-S-triazine, 2-(p-chlorophenyl)-4,6-bis(trichloromethyl)-S-triazine, 2-(p-tolyl)-4,6-bis(trichloromethyl)-S-triazine, 2-(p-methoxyphenyl)-4,6-bis(trichloromethyl)-S-triazine, 2-(2',4'-dichlorophenyl)-4,6-bis(trichloromethyl)-S-triazine, 2,4,6-tris(trichloromethyl)-S-triazine, 2-methyl-4,6-bis(trichloromethyl)-S-triazine, 2-n-nonyl-4,6-bis(trichloromethyl)-S-triazine and 2-(α,α,β-trichloroethyl)-4,6-bis(trichloromethyl)-S-triazine. Further, compounds described in British Patent 1,388,492, for example, 2-styryl-4,6-bis(trichloromethyl)-S-triazine, 2-(p-methylstyryl)-4,6-bis(trichloromethyl)-S-triazine, 2-(p-methoxystyryl)-4,6-bis(trichloromethyl)-S-triazine and 2-(p-methoxylstyryl)-4-amino-6-trichloromethyl-S-triazine, compounds described in JP-A-53-133428, for example, 2-(4-methoxynaphth-1-yl)-4,6-bis(trichloromethyl)-S-triazine, 2-(4-ethoxynaphth-1-yl)-4,6-bis(trichloromethyl)-S-triazine, 2-[4-(2-ethoxyethyl)naphth-1-yl]-4,6-bis(trichloromethyl)-S-triazine, 2-(4,7-dimethoxynaphth-1-yl)-4,6-bis(trichloromethyl)-S-triazine and 2-(acenaphth-5-yl)-4,6-bis(trichloromethyl)-S-triazine, and compounds described in German Patent 3,337,024, for example, the compounds shown below are exemplified. Moreover, compounds which can be easily synthesized by one skilled in the art according to synthesis methods described in M. P. Hutt, E. F. Elslager and L. M. Herbel, *Journal of Heterocyclic Chemistry*, Vol. 7, No. 3, page 511 et seq. (1970), for example, the compounds shown below are exemplified.

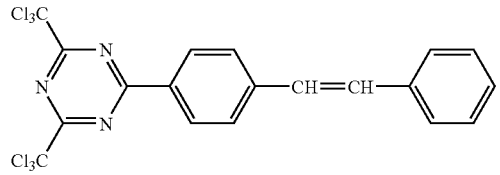

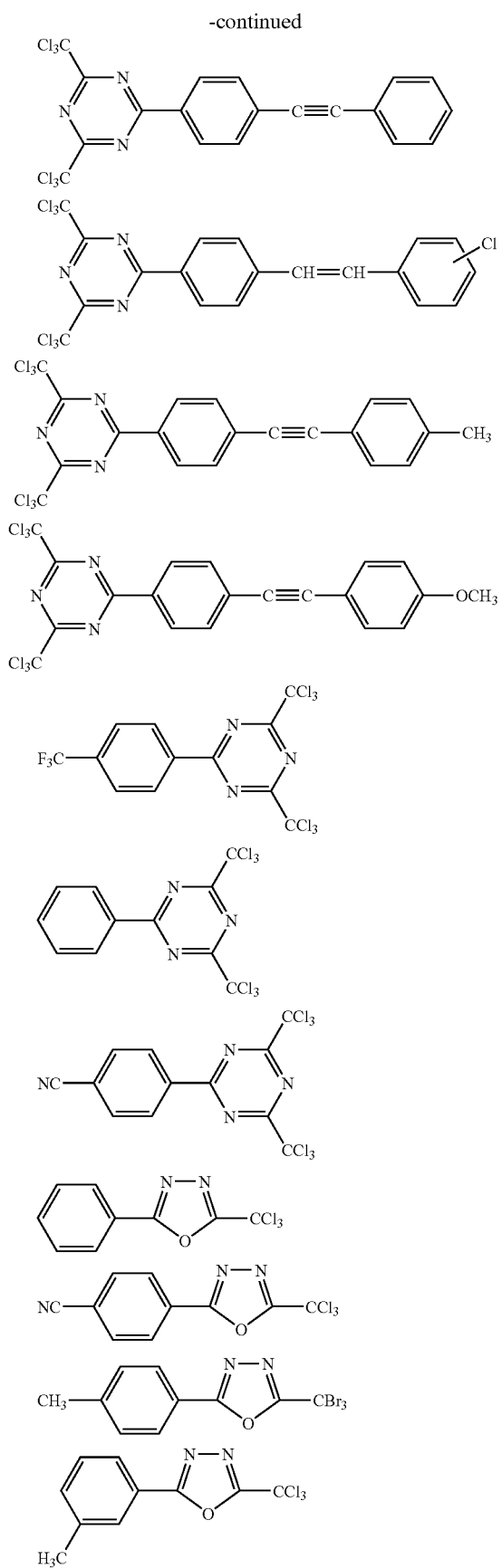

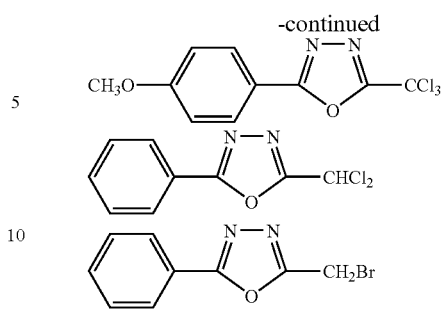

(1) Azo Series Compound

The azo series compound (I) preferably used as the radical initiator in the invention includes, for example, 2,2'-azobisisobutyronitrile, 2,2'-azobispropionitrile, 1,1'-azobis(cyclohexane-1-carbonitrile), 2,2'-azobis(2-methylbutyronitrile), 2,2'-azobis(2,4-dimethylvaleronitrile), 2,2'-azobis(4-methoxy-2,4-dimethylvaleronitrile), 4,4'-azobis(4-cyanovaleric acid), dimethyl 2,2'-azobisisobutyrate, 2,2'-azobis(2-methypropionamidooxime), 2,2'-azobis[2-(2-imidazolin-2-yl) propane], 2,2'-azobis{2-methyl-N-[1,1-bis(hydroxymethyl)-2-hydroxyethyl]propionamide}, 2,2'-azobis[2-methyl-N-(2-hydroxyethyl)propionamide], 2,2'-azobis(N-butyl-2-methylpropionamide), 2,2'-azobis(N-cyclohexyl-2-methylpropionamide), 2,2'-azobis[N-(2-propenyl)-2-methylpropionamide] and 2,2'-azobis(2,4,4-trimethylpentane).

More preferable examples of the radical initiator for use in the invention include the above-described aromatic ketone (a), onium salt compound (b), organic peroxide (c), hexaarylbiimidazole compound (e), metallocene compound (i) and compound having a carbon-halogen bond (k), and most preferable examples of the radical initiator include the aromatic iodonium salt, aromatic sulfonium salt, titanocene compound and trihalomethyl-S-triazine compound represented by formula (6) described above.

The initiator can be added to the laser-decomposable resin composition containing the polymerizable compound preferably from 0.1 to 50% by weight, more preferably from 0.5 to 30% by weight, particularly preferably from 5 to 20% by weight, based on the total solid content of the polymerizable composition.

The initiators can be preferably used individually or in combination of two or more thereof in the invention.

Other Components

To the laser-decomposable resin composition according to the invention, other components suitable for the use and production method thereof may further be appropriately added. Preferable examples of the additive are described below.

<Sensitizing Dye>

In the case wherein the exposure is conducted using as a light source, a laser (for example, YAG laser or semiconductor laser) emitting an infrared ray of 760 to 1,200 nm, an infrared absorbing agent is ordinarily used. The infrared absorbing agent absorbs a laser beam and generates heat to accelerate thermal decomposition. The infrared absorbing agent for use in the invention includes a dye and pigment each having an absorption maximum in a wavelength range of 760 to 1,200 nm.

As the dye, commercially available dyes and known dyes described in literatures, for example, *Senryo Binran* (*Dye Handbook*) compiled by The Society of Synthetic Organic Chemistry, Japan (1970) can be used. Specifically, the dye includes azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squarylium dyes, pyrylium salts and metal thiolate complexes.

Examples of preferable dye include cyanine dyes described, for example, in JP-A-58-125246, JP-A-59-84356, JP-A-59-202829 and JP-A-60-78787, methine dyes described, for example, in JP-A-58-173696, JP-A-58-181690 and JP-A-58-194595, naphthoquinone dyes described, for example, in JP-A-58-112793, JP-A-58-224793, JP-A-59-48187, JP-A-59-73996, JP-A-60-52940 and JP-A-60-63744, squarylium dyes described, for example, in JP-A-58-112792, and cyanine dyes described, for example, in British Patent 434,875.

Also, near infrared absorbing sensitizers described in U.S. Pat. No. 5,156,938 are preferably used. Further, substituted arylbenzo(thio)pyrylium salts described in U.S. Pat. No. 3,881,924, trimethinethiapyrylium salts described in JP-A-57-142645 (corresponding to U.S. Pat. No. 4,327,169), pyrylium compounds described in JP-A-58-181051, JP-A-58-220143, JP-A-59-41363, JP-A-59-84248, JP-A-59-84249, JP-A-59-146063 and JP-A-59-146061, cyanine dyes described in JP-A-59-216146, pentamethinethiopyrylium salts described in U.S. Pat. No. 4,283,475, and pyrylium compounds described in JP-B-5-13514 and JP-B-5-19702 are also preferably used. Other preferable examples of the dye include near infrared absorbing dyes represented by formulae (I) and (II) in U.S. Pat. No. 4,756,993.

Other preferable examples of the infrared absorbing dye according to the invention include specific indolenine cyanine dyes described in JP-A-2002-278057.

Of the dyes, cyanine dyes, squarylium dyes, pyrylium dyes, nickel thiolate complexes and indolenine cyanine dyes are preferred. Further, cyanine dyes and indolenine cyanine dyes are more preferred.

Specific examples of the cyanine dye preferably used in the invention include those described in Paragraph Nos. [0017] to [0019] of JP-A-2001-133969, Paragraph Nos. [0012] to [0038] of JP-A-2002-40638 and Paragraph Nos. [0012] to [0023] of JP-A-2002-23360.

The dye represented by formula (d) or formula (e) shown below is preferable from the standpoint of light-to-heat conversion property.

Formula (d)

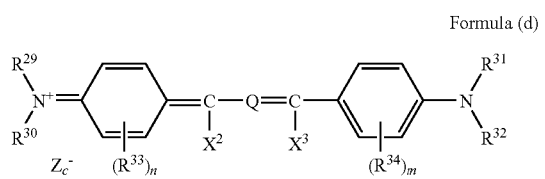

In formula (d), $R^{29}$ to $R^{32}$ each independently represents a hydrogen atom, an alkyl group or an aryl group. $R^{33}$ and $R^{34}$ each independently represents an alkyl group, a substituted oxy group or a halogen atom. n and m each independently represents an integer of 0 to 4. $R^{29}$ and $R^{30}$ or $R^{31}$ and $R^{32}$ may be combined with each other to form a ring. Also, $R^{29}$ and/or $R^{30}$ and $R^{33}$ or $R^{31}$ and/or $R^{32}$ and $R^{34}$ may be combined with each other to form a ring. Further, when plural $R^{33}$s or $R^{34}$s are present, the $R^{33}$s or $R^{34}$s may be combined with each other to form a ring. $X^2$ and $X^3$ each independently represents a hydrogen atom, an alkyl group or an aryl group, provided that at least one of $X^2$ and $X^3$ represents a hydrogen atom or an alkyl group. Q represents a trimethine group which may have a substituent or a pentamethine group which may have a substituent or may form a ring structure together with a divalent organic group. $Zc^-$ represents a counter anion. However, $Zc^-$ is not necessary when the dye represented by formula (d) has an anionic substituent in the structure thereof and neutralization of charge is not needed. Preferable examples of the counter ion for $Zc^-$ include a halogen ion, a perchlorate ion, a tetrafluoroborate ion, a hexafluorophosphate ion and a sulfonate ion, and particularly preferable examples thereof include a perchlorate ion, a hexafluorophosphate ion and an arylsulfonate ion in view of the preservation stability of a coating solution for resin composition layer.

Specific examples of the dye represented by formula (d) preferably used in the invention include those illustrated below.

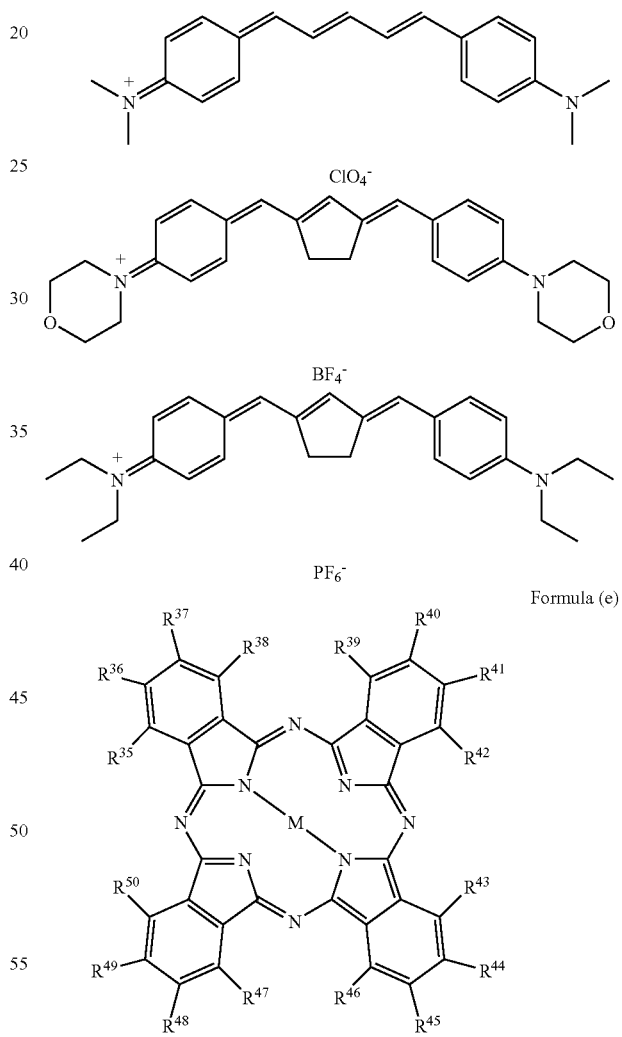

In formula (e), $R^{35}$ to $R^{50}$ each independently represents a hydrogen atom, a halogen atom, a cyano group, an alkyl group, an aryl group, an alkenyl group, an alkynyl group, a hydroxy group, a carbonyl group, a thio group, a sulfonyl group, a sulfinyl group, an oxy group, an amino group or an onium salt structure. When a substituent can be introduced into these groups, they may have the substituent. M represents two hydrogen atoms, a metal atom, a halometal group or an oxymetal group. Examples of the metal atom included therein include atoms of Groups IA, IIA, IIIB and IVB of the Periodic Table, transition metals of the first, second and third period, and lanthanoid elements. Among them, copper, magnesium, iron, zinc, cobalt, aluminum, titanium and vanadium are preferred.

Specific examples of the dye represented by formula (e) preferably used in the invention include those illustrated below.

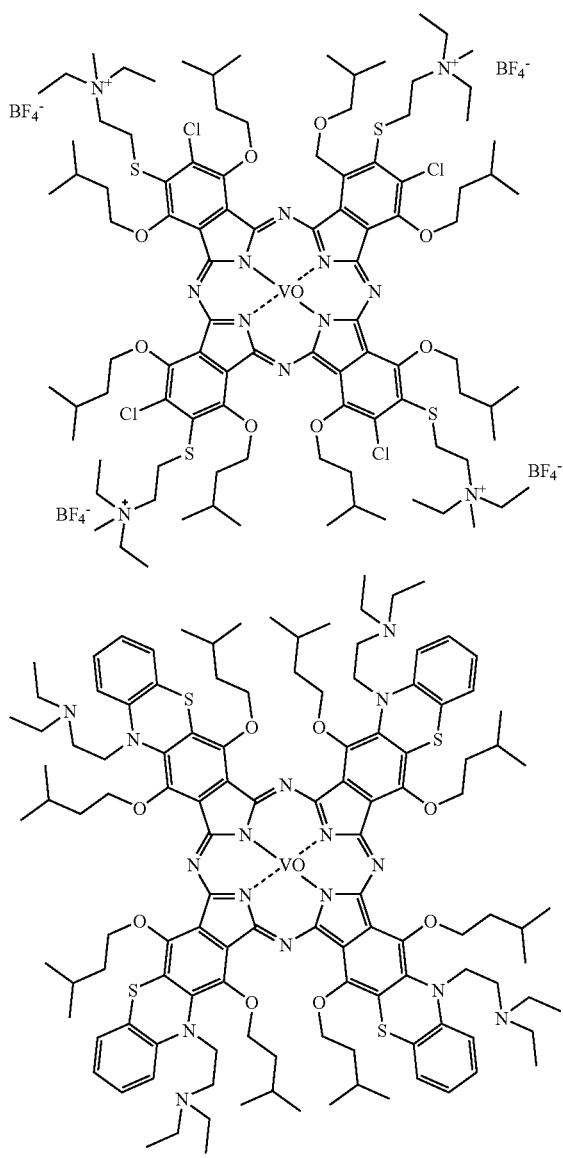

Examples of the pigment for use in the invention include commercially available pigments and pigments described in Colour Index (C.I.), Saishin Ganryo Binran (Handbook of the Newest Pigments) compiled by Pigment Technology Society of Japan (1977), Saishin Ganryo Oyou Gijutsu (Newest Application on Technologies for Pigments), CMC Publishing Co., Ltd. (1986) and Insatsu Ink Gijutsu (Printing Ink Technology), CMC Publishing Co., Ltd. (1984).

Examples of the pigment include black pigments, yellow pigments, orange pigments, brown pigments, red pigments, purple pigments, blue pigments, green pigments, fluorescent pigments, metal powder pigments and polymer-bonded dyes. Specific examples of usable pigment include insoluble azo pigments, azo lake pigments, condensed azo pigments, chelated azo pigments, phthalocyanine pigments, anthraquinone pigments, perylene and perynone pigments, thioindigo pigments, quinacridone pigments, dioxazine pigments, isoindolinone pigments, quinophthalone pigments, dying lake pigments, azine pigments, nitroso pigments, nitro pigments, natural pigments, fluorescent pigments, inorganic pigments and carbon black. Of the pigments, carbon black is preferred.

The pigment may be used without undergoing surface treatment or may be used after the surface treatment. For the surface treatment, a method of coating a resin or wax on the surface, a method of attaching a surfactant and a method of bonding a reactive substance (for example, a silane coupling agent, an epoxy compound or polyisocyanate) to the pigment surface. The surface treatment methods are described in Kinzoku Sekken no Seishitsu to Oyo (Properties and Applications of Metal Soap), Saiwai Shobo, Insatsu Ink Gijutsu (Printing Ink Technology), CMC Publishing Co., Ltd. (1984), and Saishin Ganryo Oyo Gijutsu (Newest Application on Technologies for Pigments), CMC Publishing Co., Ltd. (1986).

The pigment has a particle size of preferably from 0.01 to 10 µm more preferably from 0.05 to 1 µm particularly preferably from 0.1 to 1 µm. When the particle size of the pigment is 0.01 µm or more, stability of the pigment dispersion in a coating solution increases and when it is 10 µm or less, uniformity of the resin composition layer is good.

For dispersing the pigment, a known dispersion technique for use in the production of ink or toner may be used. Examples of the dispersing machine include an ultrasonic dispersing machine, a sand mill, an attritor, a pearl mill, a super-mill, a ball mill, an impeller, a disperser, a KD mill, a colloid mill, a dynatron, a three roll mill and a pressure kneader. The dispersing machines are described in detail in Saishin Ganryo Oyo Gijutsu (Newest Application on Technologies for Pigments), CMC Publishing Co., Ltd. (1986).

<Co-sensitizer>

The sensitivity at the photo-curing of the resin composition layer can be further improved by using a certain additive (hereinafter referred to as a "co-sensitizer"). The operation mechanism of the co-sensitizer is not quite clear but may be considered to be mostly based on the following chemical process. Specifically, the co-sensitizer reacts with various intermediate active species (for example, a radical or a cation) generated during the process of photo-reaction initiated by the photopolymerization initiator and subsequent addition-polymerization reaction to produce new active radicals. The co-sensitizers are roughly classified into (a) compound which is reduced to produce an active radical, (b) compound which is oxidized to produce an active radical and (c) compound which reacts with a radical having low activity to convert it into a more highly active radical or acts as a chain transfer agent. However, in many cases, a common view about which an individual compound belongs to which type is not present.

(a) Compound which is Reduced to Produce an Active Radical

Compound Having Carbon-halogen Bond:

An active radical is considered to be generated by the reductive cleavage of the carbon-halogen bond. Specific examples of the compound preferably used include a trihalomethyl-s-triazine and a trihalomethyloxadiazole.

Compound Having Nitrogen-nitrogen Bond:

An active radical is considered to be generated by the reductive cleavage of the nitrogen-nitrogen bond. Specific examples of the compound preferably used include a hexaarylbiimidazole.

Compound Having Oxygen-oxygen Bond:

An active radical is considered to be generated by the reductive cleavage of the oxygen-oxygen bond. Specific examples of the compound preferably used include an organic peroxide.

Onium Compound:

An active radical is considered to be generated by the reductive cleavage of a carbon-hetero bond or oxygen-nitrogen bond. Specific examples of the compound preferably used include a diaryliodonium salt, a triarylsulfonium salt and an N-alkoxypyridinium (azinium) salt.

Ferrocene and Iron-arene Complexes:

An active radical can be reductively generated.

(b) Compound which is Oxidized to Produce an Active Radical

Alkylate Complex:

An active radical is considered to be generated by the oxidative cleavage of a carbon-hetero bond. Specific examples of the compound preferably used include a triaryl alkyl borate.

Alkylamine Compound:

An active radical is considered to be generated by the oxidative cleavage of a C—X bond on the carbon adjacent to nitrogen, wherein X is preferably a hydrogen atom, a carboxyl group, a trimethylsilyl group or a benzyl group. Specific examples of the compound include an ethanolamine, an N-phenylglycine and an N-trimethylsilylmethylaniline.

Sulfur-containing or Tin-containing Compound:

A compound in which the nitrogen atom of the above-described amine compound is replaced by a sulfur atom or a tin atom is considered to generate an active radical in the same manner. Also, a compound having an S—S bond is known to effect sensitization by the cleavage of the S—S bond.

α-Substituted Methylcarbonyl Compound:

An active radical can be generated by the oxidative cleavage of carbonyl-a-carbon bond. The compound in which the carbonyl is converted into an oxime ether also shows the similar function. Specific examples of the compound include an 2-alkyl-1-[4-(alkylthio)phenyl]-2-morpholinopronone-1 and an oxime ether obtained by a reaction of the 2-alkyl-1-[4-(alkylthio)phenyl]-2-morpholinopronone-1 with a hydroxyamine and subsequent etherification of the N—OH.

Sulfinic Acid Salt:

An active radical can be reductively generated. Specific examples of the compound include sodium arylsulfinate.

(c) Compound which Reacts with a Radical to Convert it into a More Highly Active Radical or Acts as a Chain Transfer Agent:

For example, a compound having SH, PH, SiH or GeH in its molecule is used as the compound which reacts with a radical to convert it into a more highly active radical or acts as a chain transfer agent. The compound donates hydrogen to a low active radical species to generate a radical or is oxidized and deprotonized to generate a radical. Specific examples of the compound include a 2-mercaptobenzothiazole, a 2-mercaptobenzoxazole and a 2-mercaptobenzimidazole.

A large number of examples of the co-sensitizer are more specifically described, for example, in JP-A-9-236913 as additives for the purpose of increasing sensitivity, and they can be used in the invention. Some of them are set forth below, but the invention should not be construed as being limited thereto. In the formulae below, -TMS indicates a trimethylsilyl group.

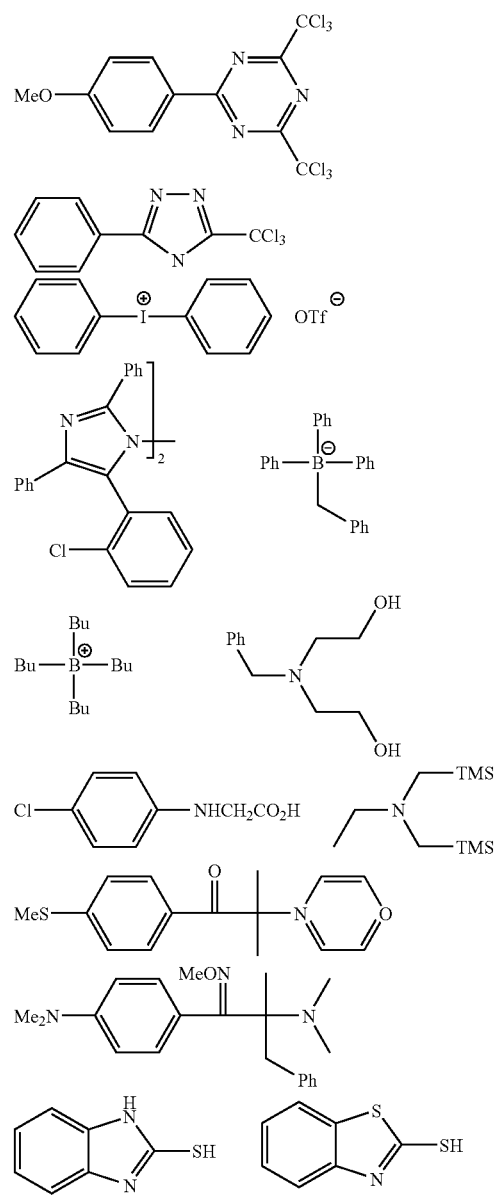

Similarly to the above-described sensitizing dye, the co-sensitizer can be subjected to various chemical modifications so as to improve the characteristics of the resin composition layer. For instance, methods, for example, binding to the sensitizing dye, initiator compound, addition-polymerizable unsaturated compound or other part, introduction of a hydrophilic site, introduction of a substituent for improving compatibility or inhibiting deposition of crystal, introduction of a substituent for improving an adhesion property, and formation of a polymer, may be used.

The co-sensitizers may be used individually or in combination of two or more thereof. The amount of the co-sensitizer used is ordinarily from 0.05 to 100 parts by weight, preferably from 1 to 80 parts by weight, more preferably from 3 to 50 parts by weight, per 100 parts by weight of the polymerizable compound having an ethylenically unsaturated double bond.

<Polymerization Inhibitor>

It is preferred to add a small amount of a thermal polymerization inhibitor to the resin composition according to the invention in addition to the above-described components, in order to prevent undesirable thermal polymerization of the polymerizable compound having an ethylenically unsaturated double bond during the production or preservation of the resin composition. Suitable examples of the thermal polymerization inhibitor include hydroquinone, p-methoxyphenol, di-tert-butyl-p-cresol, pyrogallol, tert-butylcatechol, benzoquinone, 4,4'-thiobis(3-methyl-6-tert-butylphenol), 2,2'-methylenebis(4-methyl-6-tert-butylphenol) and N-nitrosophenylhydroxyamine cerium(III) salt. The amount of the thermal polymerization inhibitor added is preferably from about 0.01 to about 5% by weight based on the total resin composition. In order to avoid polymerization inhibition due to oxygen, a higher fatty acid derivative, for example, behenic acid or behenic amide may be added and allowed to localize on the resin composition layer surface during the drying step after the coating thereof on a support, if desired. The amount of the higher fatty acid derivative added is preferably from about 0.5 to about 10% by weight based on the total resin composition.

<Coloring Agent>

A coloring agent, for example, a dye or a pigment may further be added for the purpose of coloring the resin composition layer. By the coloring, visibility of the image area or aptitude for an image density measurement apparatus can be improved. A pigment is preferably used as the coloring agent. Specific examples the coloring agent include a pigment, for example, a phthalocyanine pigment, an azo pigment, carbon black or titanium oxide, and a dye, for example, Ethyl Violet, Crystal Violet, an azo dye, an anthraquinone dye or a cyanine dye. The amount of the coloring agent added is preferably from about 0.5 to about 5% by weight based on the total resin composition.

<Other Additives>

Further, known additives, for example, a filler or a plasticizer may be added for improving physical properties of the cured layer.

The filler may be an organic compound, an inorganic compound or a mixture thereof. Examples of the organic compound include carbon black, carbon nanotube, fullerene and graphite. Examples of the inorganic compound include silica, alumina, aluminum and calcium carbonate.

Examples of the plasticizer include dioctyl phthalate, didodecyl phthalate, triethylene glycol dicaprylate, dimethyl glycol phthalate, tricresyl phosphate, dioctyl adipate, dibutyl sebacate and triacetyl glycerol. In the case of using a binder, the plasticizer can be added in an amount of 10% by weight or less based on the total weight of the compound having an ethylenically unsaturated double bond and the binder.

<Pattern-forming Material>

The pattern-forming material of the invention comprises a support having thereon a layer comprising the decomposable resin composition according to the invention. The layer (hereinafter, also referred to as a pattern-forming layer) comprising the decomposable resin composition may further contain the above-described polymerizable compound, initiator and other components, if desired.

The term "pattern-forming material comprising a layer comprising the laser-decomposable resin composition" as used herein means in general a pattern-forming material wherein based on laser exposure, the exposed area forms a concave portion of the concavo-convex pattern. Although the concave portion may be formed by conducting heating treatment or development processing with an aqueous alkali solution or the like after the laser exposure, the pattern-forming material of the invention is preferably used to form the concave portion directly (for example, by ablation) by the laser exposure.

As for the pattern-forming material preferably used according to the invention, the use thereof is not particularly restricted, as long as the above-described characteristic is fulfilled, and it can be utilized over a wide range, for instance, in a printing plate precursor, for example, for lithographic printing, gravure printing, letterpress or screen printing, a printed circuit board, a photoresist material for semiconductor and a recording material for optical disc. According to the invention, the pattern-forming material is preferably used as a printing plate precursor for direct plate-making by engraving with laser, so-called "laser engraving". In particular, it is preferably used as a flexographic printing plate precursor and a flexographic printing plate precursor for laser engraving is most preferable for the pattern-forming material according to the invention.

(Support)

A material having flexibility and excellent dimensional stability is preferably used as the support of the pattern-forming material in the invention. Examples of the support include a polyethylene terephthalate film, a polyethylene naphthalate film, a polybutylene terephthalate film and a polycarbonate film. The thickness of the support is preferably from 50 to 350 μm and more preferably from 100 to 250 μm from the standpoint, for example, of mechanical characteristics, shape stability and handling property of the pattern-forming material. Also, in order to increase adhesion between the support and the pattern-forming layer, a known adhesive layer conventionally used for such a purpose may be provided on the surface of the support, if desired.

Further, the adhesion property to the pattern-forming layer or the adhesive layer can be improved by conducting physical or chemical treatment on the surface of support used in the invention. Examples of the physical treatment include a sand blast method, a wet sand blast method spraying liquid containing fine particles, a corona discharge treatment method, a plasma treatment method or an ultraviolet ray or vacuum ultraviolet ray irradiation treatment method. Examples of the chemical treatment include a strong acid treatment method, a strong alkali treatment method, an oxidant treatment method and a coupling agent treatment method.

(Formation of Film)

In order to mold the laser-decomposable resin composition according to the invention into a sheet form, a roll form or a cylindrical form, a molding method for conventional resin can be used. For example, a casting method, a method of extruding the resin composition from a nozzle or dies using a machine, for example, a pump or an extruder and adjusting the thickness by a blade or by calendering with a roller is exemplified. In such case, it is also possible to perform the molding accompanied with heating within a range wherein the performance of the resin composition is not damaged. Also, a rolling treatment, a grinding treatment or the like may be carried out, if desired. Ordinarily, the resin composition is molded on an underlay referred to as a back film composed of a material, for example, PET or nickel in many cases. Further, a cylindrical support made of fiber reinforced plastic (FRP), plastic or metal can also be used. As the cylindrical support, a hollow cylindrical support having a constant thickness can be used for the purpose of weight saving. The role of the back film or cylindrical support is to ensure the dimensional stability of pattern-forming material. Therefore, a material with high dimensional stability should be selected. Specific examples of the material include a crystalline resin, for example, a polyester resin, a polyimide resin, a polyamide resin, polyamideimide resin, a polyetherimide resin, polybismaleimide resin, a polysulfone resin, a polycarbonate resin, a polyphenyleneether resin, a polyphenylenethioether resin, a polyethersulfone resin or a full aromatic polyester resin, a full aromatic polyamide resin and an epoxy resin. Further, the resins may be used in the form of laminate. For example, a sheet composed of a full aromatic polyamide film having a thickness of 4.5 μm both surfaces of which are laminated with a polyethylene terephthalate layer having a thickness of 50 μm is exemplified. Moreover, a porous sheet, for example, a cloth formed by knitting of fiber, a nonwoven cloth or a film having fine pores can be used as the back film. In the case of using a porous sheet as the back film, when the resin composition is impregnated into the pores of the porous sheet and subjected to light curing, a high adhesive property can be achieved by means of integration of the cured resin layer and the back film. Examples of the fiber for the formation of cloth or nonwoven cloth include, an inorganic fiber, for example, a glass fiber, an alumina fiber, a carbon fiber, an alumina-silica fiber, a boron fiber, a high silicon fiber, a potassium titanate fiber or a sapphire fiber, a natural fiber, for example, cotton or hemp, a semisynthetic fiber, for example, rayon or acetate, and a synthetic fiber, for example, nylon, polyester, acryl, vinylon, polyvinyl chloride, polyolefin, polyurethane, polyimide or aramide. Furthermore, cellulose produced by a bacterium is a high crystalline nanofiber and a material capable of forming a thin and highly dimensionally stable nonwoven fiber.

It is preferred from the standpoint of increasing the strength of layer formed that the laser-decomposable resin composition according to the invention is cured by crosslinking (polymerization) before the decomposition with laser. In order to cure the resin composition, it is preferred to incorporate the polymerizable compound as described above into the resin composition. This method is ordinarily employed as a means for increasing the strength of layer in a negative-type (polymerization type) photosensitive material, and it is believed that the similar result can also be achieved in the invention.

As for the laser-decomposable resin composition containing the above-described polymer compound according to the invention, removability of scrap generated at the laser engraving is further improved by conducting such curing.

The method is particularly effective in the case wherein the pattern-forming material is a flexographic printing plate precursor for laser engraving. By the curing before the laser engraving, advantages are obtained, in that a relief formed by the laser engraving becomes sharp and in that tackiness of engraved scrap generated at the laser engraving can be restrained.

The method for curing the resin composition can be used without any particular limitation as long as it is possible to cause polymerization reaction of the polymerizable compound, for example, to heat the composition, to irradiate the composition with light or to incorporate a photo- or heat-polymerization initiator or the like into the composition and to perform light irradiation of heating.

Among them, as the method for curing, the heating of the composition is preferable in view of ease of operation. For the heating to cause curing (polymerization) of the composition before the laser decomposition, any heating method, for example, an oven, a thermal head, a heating roll or a laser beam can be used. When the temperature control is necessary, it can be performed by controlling the temperature of the oven, thermal head or heating roll or by controlling the intensity or spot diameter of the laser beam. The heating temperature is preferably from 40 to 250° C., more preferably from 60 to 220° C., and still more preferably from 80 to 200° C., from the standpoint of thermal stability of the coexisting organic compound. The heating time is preferably from 1 to 120 minutes, and more preferably from 5 to 60 minutes, in view of preventing the occurrence of a side reaction (for example, thermal decomposition of additive) other than the curing by heating.

The thickness of the laser-decomposable resin composition layer is ordinarily from 0.0005 to 10 mm, and preferably from 0.005 to 7 mm.

The thickness for use in the laser engraving (particularly in the flexographic printing plate precursor for laser engraving) can be appropriately determined depending on the purpose of utilization. The thickness is preferably in a range of 0.05 to 10 mm, and more preferably in a range of 0.1 to 7 mm. In some cases, the layers having different compositions may be multiply laminated.

As a combination of plural layers, for example, it is possible to from a layer capable of undergoing engraving using a laser having an emitting wavelength in a near infrared region, for example, a YAG laser, a fiber laser or a semiconductor laser as the uppermost layer and under the layer, a layer capable of undergoing laser engraving using an infrared laser, for example, a carbon dioxide gas laser or a visible-ultraviolet laser is formed. In the case of conducting the laser engraving of such laminate, different laser engraving apparatus equipped with an infrared laser and a near infrared laser respectively can be employed or one laser engraving apparatus equipped with both of an infrared laser and a near infrared laser can be employed.

According to the invention, a cushion layer composed of a resin or rubber having cushioning property can be formed between the support and the pattern-forming layer or between the pattern-forming layer and the adhesive layer. In the case of forming the cushion layer between the support and pattern-forming layer, a method of preparing the cushion layer having an adhesive layer on one side and pasting the adhesive layer side thereof onto the support is simple. After pasting the cushioning layer, the surface may be subjected to cutting and polishing to shape. In a simpler manner, a liquid adhesive composition is coated on the support in a constant thickness and cured with light to from the cushion layer. It is preferable for the cushion layer to have the cushioning property that the hardness of the cushion layer cured with light is low. The resin layer cured with light having the cushioning property may contain bubbles.

<Laser Engraving>

In the laser engraving, a relief image is formed on the pattern-forming material by making digitalized data based on the image to be formed and operating a laser equipment utilizing a computer.

As described above, the pattern-forming material for use in laser engraving is not particularly restricted, and the flexographic printing plate precursor for laser engraving is particularly preferably used.

The laser used in the laser engraving can be any laser as long as it is able to form a pattern by laser ablation of the pattern-forming material. In order to carry out the engraving with high speed, a laser having a high power is desirable. One preferable example of the laser is a laser having an emitting wavelength in an infrared region or near infrared region, for example, a carbon dioxide gas laser, a YAG laser, a semiconductor laser or a fiber laser. Also, an ultraviolet laser having an emitting wavelength in an ultraviolet region, for example, an excimer laser, a YAG laser wavelength-converted to the third harmonic or the fourth harmonic or a copper vapor laser is also able to conduct ablation processing which cleaves a bond between molecules of organic compound and thus is suitable for microfabrication. A laser having an extremely high peak power, for example, a femtosecond laser can also be employed. The laser irradiation may be performed continuously or pulsewise. As for the flexographic printing plate precursor for laser engraving, a carbon dioxide gas laser or a YAG laser is preferably used.

Although the engraving with laser is conducted under oxygen-containing gas, ordinarily in the presence of air or in airflow, it can be conducted under carbon dioxide gas or nitrogen gas. After the completion of the engraving, the powdery or liquid substance (scrap) occurred on the surface of relief image can be removed by an appropriate method, for example, a method of washing out, for example, with a solvent or water containing a surfactant, a method of spraying an aqueous cleaning agent, for example, by a high-pressure sprayer, a method of spraying high-pressure steam, or a method of wiping off with cloth or the like.

The laser-decomposable resin composition according to the invention can be applied to various usages, for example, a stamp, a seal, a design roll for embossing, a relief image for patterning an insulator, resistor or conductive paste used for the production of electronic components, a relief image for a mold material of ceramic materials, a relief image for display, for example, an advertising board or a sign board, or a prototype or matrix of various moldings, as well as the relief image.

It is also achieved to decrease tackiness on the surface of pattern image by forming a modifying layer on the surface of pattern image after the laser engraving. As the modifying layer, a coating treated with a compound reacting with the surface hydroxy group of the pattern image, for example, a silane coupling agent or a titanium coupling agent or a polymer film containing porous inorganic particles is exemplified. The silane coupling agent widely used is a compound having in its molecule a functional group having high reactivity with the surface hydroxy group of the pattern image. Examples of such a functional group include a trimethoxysilyl group, an triethoxysilyl group, a trichlorosilyl group, a diethoxysilyl group, a dimethoxysilyl group, a dichlorosilyl group, a monoethoxysilyl group, a monomethoxysilyl group and a monochlorosilyl group. At least one of the functional groups is present in the molecule of the compound and the compound is fixed on the surface of the pattern image by the reaction of the functional group with the surface hydroxy group of the pattern image. Further, as the compound constituting the silane coupling agent according to the invention, that having in its molecule at least one reactive functional group selected from an acryloyl group, a methacryloyl group, an active halogen-containing amino group, an epoxy group, a vinyl group, a perfluoroalkyl group and a mercapto group or that having in its molecule a long chain alkyl group is also used. When the coupling agent fixed on the surface has particularly a polymerizable reactive group in its molecule, the more solid coating can be formed by irradiating the surface with light, heat or an electron beam to form crosslinkage after the fixing the coupling agent on the surface.

EXAMPLES

The present invention will be described in more detail with reference to the following examples, but the invention should not be construed as being limited thereto.

<Model Experiment of Decomposition of Polyurethane Resin>

Examples 1 to 8 and Comparative Examples 1 to 2

A pattern-forming layer was prepared using the composition shown below.

| <Composition of sample for Examples 1 to 8> | |
| --- | --- |
| Polyurethane resin shown in Table 1 below | 85% by weight |
| Base compound (BR-1) shown in Table 1 below | 15% by weight |

The polyurethane resin and Base compound (BR-1) were dissolved in tetrahydrofuran (THF) to prepare a solution having solid concentration of 10% by weight and 10 g of the solution was cast in an aluminum cup plate. The solution was dried in the atmosphere at room temperature for 24 hours to prepare a urethane resin sample (before heating) containing the base compound.

The urethane resin sample was heated at 150° C. for 2 hours using an oven to prepare a urethane resin sample (after heating). The urethane resin sample (before heating) containing the base compound and the urethane resin sample (after heating) were again dissolved in THF respectively and a molecular weight (weight average molecular weight) was measured using GPC (high-speed GPC system HLC-8220GPC, produced by Tosoh Corp.).

<Composition of Sample for Comparative Examples 1 to 2>

The resin samples were prepared in the same manner as in Examples 1 to 8 except for eliminating Base compound (BR-1) and molecular weighs of the samples before heating and after heating were measured by GPC in the same manner as in Examples 1 to 8.

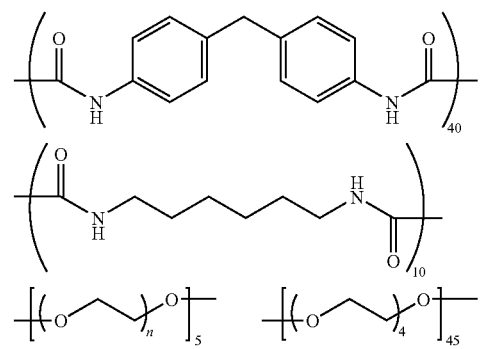

(PR-1)

-continued

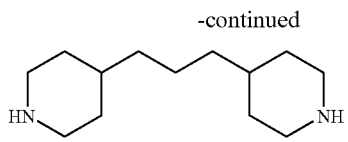
(BR-1)

The results obtained are shown in Table 1.

TABLE 1

| | Polyurethane Resin | Molecular Weight before Heating | Molecular Weight after Heating |
|---|---|---|---|
| Example 1 | P-3 | 3.0 | 0.0 |
| Example 2 | P-7 | 4.8 | 0.2 |
| Example 3 | P-11 | 3.0 | 0.0 |
| Example 4 | P-17 | 4.9 | 0.1 |
| Example 5 | P-23 | 4.5 | 0.2 |
| Example 6 | P-27 | 2.9 | 0.0 |
| Example 7 | P-31 | 4.0 | 0.1 |
| Example 8 | P-32 | 3.9 | 0.1 |
| Comparative Example 1 | P-11 | 3.0 | 3.0 |
| Comparative Example 2 | PR-1 | 3.5 | 3.5 |

In Table 1, the unit of the molecular weight is ten thousands.

In Table 1, the molecular weight after heating of 0.0 indicates that the urethane polymer was decomposed into a monomer level.

As shown in Table 1, the decrease in the molecular weight was recognized in each of the samples wherein the polyurethane resin according to the invention is used in combination with the model base compound as in Examples 1 to 8 by the heating experiment. On the contrary, the decrease in the molecular weight was not recognized in Comparative Examples 1 and 2 wherein the base compound was not added. From these results, it is believed that the molecular weight of the polyurethane resin decreases upon the function of the base compound to cleave the urethane bonds.

<Experiment of Decomposition with Laser>

Examples 9 to 25 and Comparative Examples 3 to 5

A pattern-forming layer was prepared using the composition shown below.

| <Composition for pattern-forming layer> | |
|---|---|
| Polyurethane resin shown in Table 2 below | X % by weight |
| Base generator shown in Table 2 below | Y % by weight |

| <Composition for pattern-forming layer> | |
|---|---|
| Base propagator shown in Table 2 below | Z % by weight |
| Polymerizable compound: Hexanediol dimethacrylate | 16.00% by weight |
| Initiator: Benzyl dimethyl ketal | 4.00% by weight |
| Laser absorber: Finely divided carbon black | 2.00% by weight |
| Additive (ozone degradation preventing wax): 1,4-Benzoquinone | 1.00% by weight |
| Resin added: TR2000 (produced by JSR Corp.) | [77 − (X + Y + Z)]% by weight |

The polyurethane resin, resin added, base generator, base propagator, additive and laser absorber were mixed in a kneader for laboratory at temperature of 100° C. for 15 minutes to uniformly disperse the laser absorber. The resulting mixture was then dissolved in methylene chloride together with the polymerizable compound and initiator at 60° C., cooled to 40° C. and cast on a polyethylene terephthalate (PET) film having a thickness of 125 μm The film was dried in the atmosphere at room temperature for 24 hours and then dried at 60° C. for 3 hours. Thereafter, the patter-forming layer (layer thickness: 1,000 μm) formed was laminated to a PET film having a thickness of 125 μm provided with an adhesive layer. Thus, the patter-forming layer was transferred to the PET film having a thickness of 125 μm provided with an adhesive layer. Then, the whole surface of the patter-forming layer was irradiated with UVA light for 15 minutes to prepare a sample.

The evaluation of the depth of engraving with laser was performed as follows. Specifically, the engraving with laser was performed using a high-grade CO2 Laser Marker ML-9100 Series (produced by Keyence Corp.) at 12 W and line speed of 20 cm/sec with respect to a carbon dioxide ($CO_2$) laser or using a Marker Engine 3000 (produced by Laserfront Technologies, Inc.) at 10 W and line speed of 10 cm/sec with respect to a Nd-YAG laser. The difference of height between the laser irradiation portion (concave portion) and laser unirradiation portion was measured by ultra-deep profile measuring microscope (VK-8500, produced by Keyence Corp.). Also, the stability at the time of formation of thick film was evaluated according to the following criteria:

OO: thick layer can be formed x: thick layer can not be formed because of the occurrence of decomposition reaction or the like at the time of formation of thick film The results are shown in Table 2.

TABLE 2

Evaluation Results of Depth of Engraving

| | Polyurethane Resin | Base Generator | Base Propagator | Resin Added | Kind of Laser | Depth of Engraving (μm) | Stability at Formation of Thick Film |
|---|---|---|---|---|---|---|---|
| Example 9 | P-3 (60) | B-6 (17) | none | none | $CO_2$ | 600 | OO |
| Example 10 | P-7 (60) | B-6 (17) | none | none | $CO_2$ | 500 | OO |
| Example 11 | P-11 (60) | B-6 (17) | none | none | $CO_2$ | 700 | OO |

TABLE 2-continued

Evaluation Results of Engraving

|  | Polyurethane Resin | Base Generator | Base Propagator | Resin Added | Kind of Laser | Depth of Engraving (μm) | Stability at Formation of Thick Film |
|---|---|---|---|---|---|---|---|
| Example 12 | P-11 (60) | B-10 (17) | none | none | $CO_2$ | 680 | OO |
| Example 13 | P-11 (60) | B-19 (17) | none | none | $CO_2$ | 690 | OO |
| Example 14 | P-11 (60) | B-21 (17) | none | none | $CO_2$ | 750 | OO |
| Example 15 | P-11 (60) | B-6 (7) | 1-1 (10) | none | $CO_2$ | 740 | OO |
| Example 16 | P-11 (60) | B-6 (7) | 2-1 (10) | none | $CO_2$ | 730 | OO |
| Example 17 | P-11 (30) | B-6 (17) | none | TR2000 (30) | $CO_2$ | 560 | OO |
| Example 18 | P-11 (60) | B-6 (17) | none | none | Nd-YAG | 450 | OO |
| Example 19 | P-17 (60) | B-6 (17) | none | none | $CO_2$ | 600 | OO |
| Example 20 | P-17 (60) | B-21 (17) | none | none | $CO_2$ | 650 | OO |
| Example 21 | P-17 (60) | B-6 (7) | 1-1 (10) | none | $CO_2$ | 620 | OO |
| Example 22 | P-23 (60) | B-6 (17) | none | none | $CO_2$ | 610 | OO |
| Example 23 | P-27 (60) | B-6 (17) | none | none | $CO_2$ | 650 | OO |
| Example 24 | P-31 (60) | B-6 (17) | none | none | $CO_2$ | 630 | OO |
| Example 25 | P-32 (60) | B-6 (17) | none | none | $CO_2$ | 600 | OO |
| Comparative Example 3 | P-11 (77) | none | none | none | $CO_2$ | 400 | OO |
| Comparative Example 4 | P-11 (77) | none | none | none | Nd-YAG | 200 | OO |
| Comparative Example 5 | PR-1 (77) | none | none | none | $CO_2$ | 350 | OO |

In Table 2, the numeric number in the parentheses indicates the amount added (% by weight) of the component.

As shown in Table 2, it can be seen that the depth of engraving, which is an index of the decomposability in the laser decomposition experiment, increases in each of Examples 9 to 25 in comparison with the comparative examples wherein the base generator is not added. It is believed that when the above results are considered together with the data of the model experiment above, the molecular weight of the urethane resin decreases upon the effect of cleavage of the urethane resin due to a base generated from the base generator thereby increasing the decomposability. It is also apparent that when the base propagator is used together with the base generator, the laser decomposability is further increased. It is believed that this is because the amount of base generated is increased by the base propagator.

This application is based on Japanese Patent application JP 2006-233336, filed Aug. 30, 2006, and Japanese Patent application JP 2007-42846, filed Feb. 22, 2007, the entire content of which is hereby incorporated by reference, the same as if fully set forth herein.

Although the invention has been described above in relation to preferred embodiments and modifications thereof, it will be understood by those skilled in the art that other variations and modifications can be effected in these preferred embodiments without departing from the scope and spirit of the invention.

What is claimed is:

1. A flexographic printing plate precursor for laser engraving comprising a layer comprising a decomposable resin composition wherein the decomposable resin composition comprises:

a base generator; and a polyurethane resin capable of being decomposed with a base generated from the base generator.

2. A flexographic printing plate precursor for laser engraving comprising a layer comprising a laser-decomposable resin composition wherein the laser-decomposable resin composition comprises:

a base generator; and a polyurethane resin capable of being decomposed with a base generated from the base generator.

3. A flexographic printing plate precursor for laser engraving comprising a layer comprising a resin composition for image formation wherein the resin composition for image formation comprises:

a base generator; and a polyurethane resin capable of being decomposed with a base generated from the base generator.

4. The flexographic printing plate precursor for laser engraving comprising a decomposable resin composition as claimed in claim 1, wherein the decomposable resin composition further comprises a base propagator.

5. The flexographic printing plate precursor for laser engraving comprising a decomposable resin composition claimed in claim 1, wherein the decomposable resin composition further comprises a polymerizable compound.

6. The flexographic printing plate precursor for laser engraving of claim 5, wherein the decomposable resin composition as recited in claim 5 has been cured.

7. The flexographic printing plate precursor for laser engraving comprising a decomposable resin composition as claimed in claim 1, wherein the polyurethane resin is synthesized from a diol monomer represented by at least one of the formulae (III) and (IV):

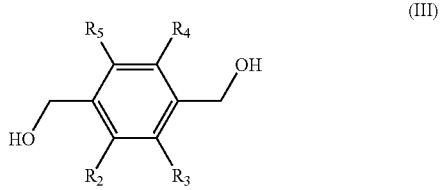

(III)

-continued
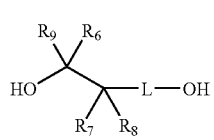
(IV)
wherein
R$_2$ to R$_5$ each represents a hydrogen atom or a monovalent substituent;
R$_6$ to R$_9$ each represents a hydrogen atom or a monovalent substituent; and
L represents a divalent connecting group.
* * * * *